US006730966B2

(12) United States Patent
Koyama

(10) Patent No.: US 6,730,966 B2
(45) Date of Patent: May 4, 2004

(54) EL DISPLAY USING A SEMICONDUCTOR THIN FILM TRANSISTOR

(75) Inventor: Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/725,798

(22) Filed: Nov. 29, 2000

(65) Prior Publication Data

US 2001/0002703 A1 Jun. 7, 2001

(30) Foreign Application Priority Data

Nov. 30, 1999 (JP) .......................................... 11-341272
Aug. 30, 2000 (JP) ........................................ 2000-260061

(51) Int. Cl.[7] ........................ H01L 27/01; H01L 27/12; H01L 31/0392; H01L 29/04; H01L 31/20
(52) U.S. Cl. .......................... 257/350; 257/59; 257/72
(58) Field of Search ............................ 257/59, 72, 350

(56) References Cited

U.S. PATENT DOCUMENTS

| 4,356,429 A | 10/1982 | Tang ........................... 313/503 |
| 4,539,507 A | 9/1985 | VanSlyke et al. ........... 313/504 |
| 4,720,432 A | 1/1988 | VanSlyke et al. ........... 428/457 |
| 4,769,292 A | 9/1988 | Tang et al. .................. 428/690 |

(List continued on next page.)

FOREIGN PATENT DOCUMENTS

| EP | 717 445 A2 | 6/1996 |
| EP | 776 147 A1 | 5/1997 |
| EP | 0 778 556 | 6/1997 |
| EP | 1 061 497 | 12/2000 |
| GB | 2 336 459 | 10/1999 |

(List continued on next page.)

OTHER PUBLICATIONS

Zou, D. et al, "Improvement of Current–Voltage Characteristics in Organic Light Emitting Diodes by Application of Reversed–Bias Voltage," *Jpn. Appl. Phys.*, vol. 37, Part 2, No. 11B pp. L1406–L1408, Nov. 15, 1998.
Schenk, H. et al, "Polymers for Light Emitting Diodes," *EuroDisplay '99*, Proceedings of the 19th International Display Research Conference, Berlin, Germany, Sep. 6–9, 1999, pp. 37–37.
English abstract re Japanese Patent Application No. 8–078519, published Mar. 22, 1996.
English abstract re Japanese Patent Application No. 8–241048, published Sep. 17, 1996.
English abstract re Japanese Patent Application No. 9–148066, published Jun. 6, 1997.
English abstract re Japanese re Japanese Patent Application No. 10–092576, published Apr. 11, 1998.
English abstract re Japanese Patent Application No. 10–189525, published Jul. 21, 1998.
English abstract re Japanese Patent Application No. 10–247735, published Sep. 14, 1998.
U.S. application No. 09/532,166, (pending) including specification, claims, abstract and drawings.

(List continued on next page.)

*Primary Examiner*—Ngân V. Ngô
(74) *Attorney, Agent, or Firm*—Cook, Alex, McFarron, Manzo, Cummings & Mehler, Ltd.

(57) ABSTRACT

There is provided an electric device which can prevent a deterioration in a frequency characteristic due to a large electric power external switch connected to an opposite electrode and can prevent a decrease in the number of gradations. The electric device includes a plurality of source signal lines, a plurality of gate signal lines, a plurality of power source supply lines, a plurality of power source control lines, and a plurality of pixels. Each of the plurality of pixels includes a switching TFT, an EL driving TFT, a power source controlling TFT, and an EL element, and the power source controlling TFT controls a potential difference between a cathode and an anode of the EL element.

33 Claims, 25 Drawing Sheets

U.S. PATENT DOCUMENTS

| | | | |
|---|---|---|---|
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |
| 5,059,861 A | 10/1991 | Littman et al. | 313/503 |
| 5,059,862 A | 10/1991 | VanSlyke et al. | 313/503 |
| 5,061,617 A | 10/1991 | Maskasky | 430/569 |
| 5,073,446 A | 12/1991 | Scozzafava et al. | 428/323 |
| 5,151,629 A | 9/1992 | VanSlyke | 313/504 |
| 5,247,190 A | 9/1993 | Friend et al. | 257/40 |
| 5,294,869 A | 3/1994 | Tang et al. | 313/504 |
| 5,294,870 A | 3/1994 | Tang et al. | 313/504 |
| 5,399,502 A | 3/1995 | Friend et al. | 437/1 |
| 5,641,991 A | 6/1997 | Sakoh | 257/755 |
| 5,714,968 A | 2/1998 | Ikeda | 345/77 |
| 5,839,456 A | 11/1998 | Han | 134/104.1 |
| 5,882,761 A | 3/1999 | Kawami et al. | 428/69 |
| 5,990,629 A | 11/1999 | Yamada et al. | 315/169.3 |
| 6,011,529 A | 1/2000 | Ikeda | 345/77 |
| 6,087,245 A | 7/2000 | Yamazaki et al. | 438/486 |
| 6,100,860 A * | 8/2000 | Takayama et al. | 345/76 |
| 6,111,270 A * | 8/2000 | Xu et al. | 257/72 |
| 6,165,824 A | 12/2000 | Takano et al. | 438/160 |
| 6,229,506 B1 | 5/2001 | Dawson et al. | 345/82 |
| 6,236,064 B1 | 5/2001 | Mase et al. | |
| 6,246,180 B1 * | 6/2001 | Nishigaki | 315/169.3 |
| 6,246,384 B1 | 6/2001 | Sano | |
| 6,281,634 B1 * | 8/2001 | Yokoyama | 315/169.3 |
| 6,307,322 B1 * | 10/2001 | Dawson et al. | 315/169.1 |
| 6,366,025 B1 | 4/2002 | Yamada | |
| 6,433,485 B2 | 8/2002 | Tai et al. | 315/169.2 |
| 6,440,877 B1 | 8/2002 | Yamazaki et al. | 438/780 |
| 6,528,950 B2 | 3/2003 | Kimura | 315/169.3 |
| 2002/0196389 A1 | 12/2002 | Koyama | 349/69 |
| 2003/0016190 A1 | 1/2003 | Kondo | 345/55 |

FOREIGN PATENT DOCUMENTS

| | | |
|---|---|---|
| JP | 08-078159 | 3/1996 |
| JP | 08-241048 | 9/1996 |
| JP | 09-148066 | 6/1997 |
| JP | 10-092576 | 4/1998 |
| JP | 10-189525 | 7/1998 |
| JP | 10-247735 | 9/1998 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| WO | WO 90/13148 | 11/1990 |
| WO | WO 98/48403 | 10/1998 |
| WO | WO 99/42983 | 8/1999 |
| WO | WO 99/49989 | 10/1999 |
| WO | WO 99/53472 | 10/1999 |

OTHER PUBLICATIONS

U.S. application No. 09/692,713, (pending) to Koyama, filed Oct. 19, 2000, including specification, claims, abstract, drawings and PTO filing receipt.

U.S. application No. 09/692,753, (pending) to Koyama et al, filed Oct. 19, 2000, including specification, claims, abstract, drawings, preliminary amendment A and PTO filing receipt.

U.S. application No. 09/707,054, (pending) to Yamazaki et al, filed Nov. 6, 2000, including specification, claims, abstract, drawings and preliminary amendment A.

English abstract re Japanese Patent Application No. JP 10–214060, published Aug. 11, 1998.

English abstract re Japanese Patent Application No. JP 10–232649, published Sep. 2, 1998.

Full English translation re Japanese Patent Application No. JP 10–312173, published Nov. 24, 1998.

U.S. application No. 09/724,387, (pending) to Inukai, filed Nov. 28, 2000, including specification, claims, abstract, drawings and PTO filing receipt.

U.S. application No. 09/747,646, (pending) to Inukai, filed Dec. 22, 2000, including specification, claims, abstract, drawings and PTO filing receipt.

European Search Report re application EP 00 12 6217 dated Jul. 12, 2002.

Kanagu et al., "A 31–in. –Diagonal Full–Color Surface–Discharge ac Plasma Display Panel," SID 92 DIGEST, pp. 713–716, May 17, 1992.

Kawahara et al., "Simulation of Motion Picture Disturbance for AC–PDP Modeling Virtual Pixel on Retina," IEICE Transactions on Electronics, vol. E81–C, No. 11, pp. 1733–1739, Nov. 11, 1998.

2000–221942 English abstract.

2000–235370 English abstract.

2000–347621 English abstract.

2001–42822 English abstract.

JP 2001–60076 English abstract.

US Patent Application No. 09/724,387, (pending) to Inukai including PTO filing receipt specification, claims, abstract, and drawings.

US Patent Application No. 09/747,646 (pending) to Inukai including PTO filing receipt specification, claims, abstract, and drawings.

US Patent Application No. 09/836,719 (pending) to Kimura et al. including PTO filing receipt specification, claims, abstract, and drawings.

US Patent Application No. 09/840,584 (pending) to Inukai including PTO filing receipt specification, claims, abstract, and drawings.

US Patent Application No. 09/992,569 (pending) to Kimura including PTO filing receipt specification, claims, abstract, and drawings.

US Patent Application No. 10/079,072 (pending) to Kimura including PTO filing receipt specification, claims, abstract, and drawings.

JP 2000–347621 full English translation.

JP 2001–42822 full English trnslation.

US Patent Application No. 09/841,098 including specification, claims, abstract, and drawings.

US Patent Application No. 09/886,148 (pending) to Inukai including PTO filing receipt specification, claims, abstract, and drawings.

Tsutsui, T. et al, 'Electroluminescence in Organic Thin Films,' *Photochemical Processes in Organized Molecular Systems*, pp. 437–450, Elsevier Science Publishers, Tokyo, (1991).

Baldo, M.A. et al, 'Highly Efficient Phosphorescent Emission from Organic Electroluminescent Devices,' *Nature*, vol. 395, pp. 151–154, Sep. 10, (1998).

Baldo, M.A. et al, 'Very High–Efficiency Green Organic Light–Emitting Devices Based on Electrophosphorescence,' *Applied Physics Letters*, vol. 75, No. 1, pp. 4–6, Jul. 5, (1999).

Tsutsui, T. et al, 'High Quantum Efficiency in Organic Light–Emitting Devices with Iridium–Complex as a Triplet Emissive Center,' *Japanese Journal of Applied Physics*, vol. 38, part 2, No., 12B, pp. L1502–L1504, Dec. 15, (1999).

* cited by examiner

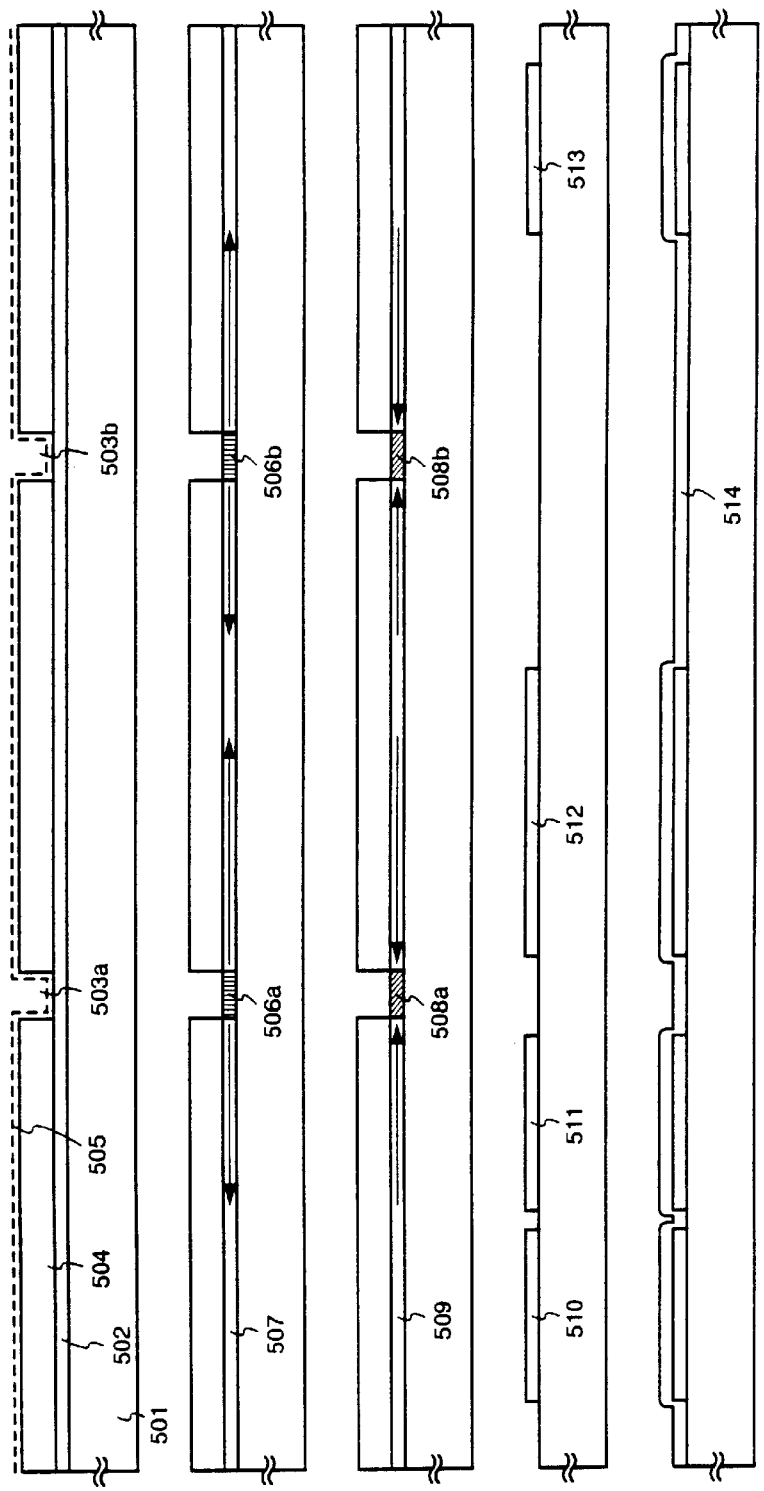

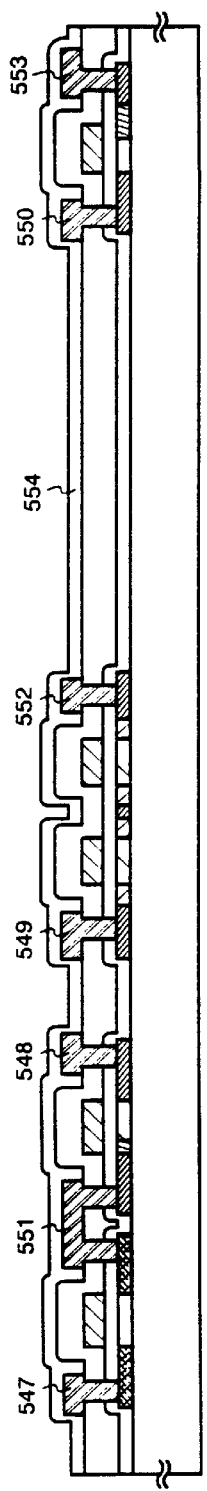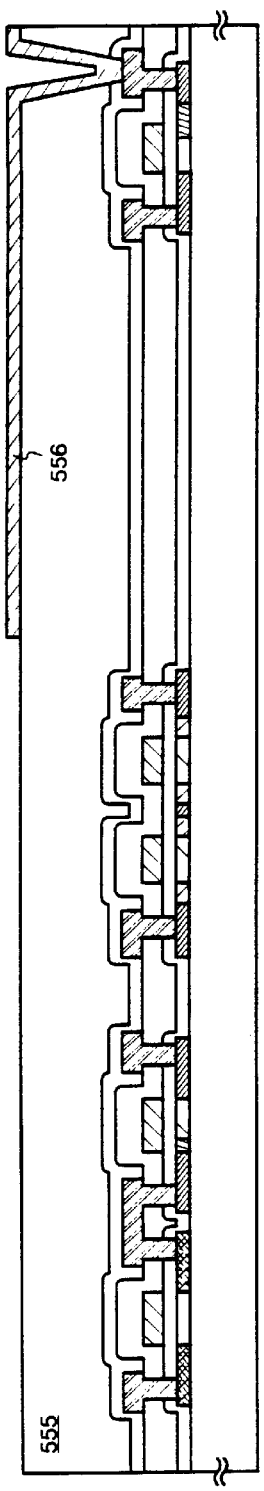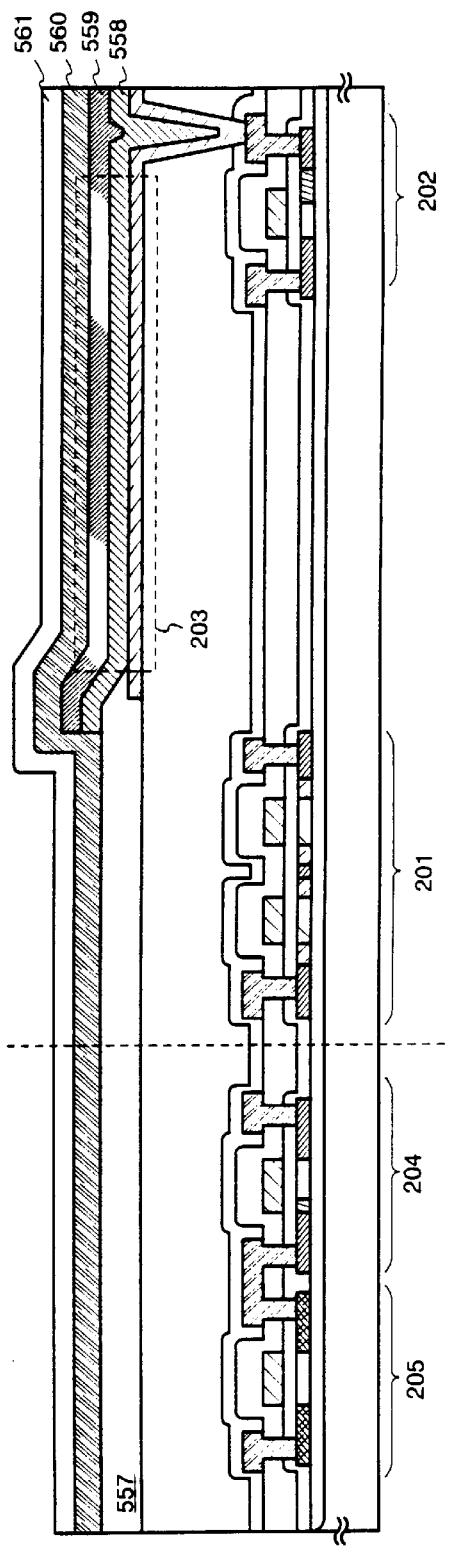
Fig.16A
Fig.16B
Fig.16C

EL DISPLAY USING A SEMICONDUCTOR THIN FILM TRANSISTOR

BACKGROUND OF THE INVENTION

1. Field of the Invention

The present invention relates to an EL (electroluminescence) display formed by incorporating an EL element on a substrate. More particularly, the invention relates to an EL display (electric device) using a semiconductor element (an element using a semiconductor thin film). Furthermore, the present invention relates to an electronic apparatus (EL display device) in which the EL display is used in a display portion thereof.

2. Description of the Related Art

In recent years, technology for forming a thin film transistor (hereinafter, TFT) on a substrate has been largely improved, and an application development of the TFT to an active matrix display device has been carried out. In particular, the TFT using a polysilicon film has a higher electric field effect mobility than the TFT using a conventional amorphous silicon film, and therefore, the former TFT may be operated at a high speed. Thus, the pixel control which has been conducted at a driver circuit outside of the substrate may be conducted at the driver circuit which is formed on the same substrate as the pixel.

Such an active matrix display device can, by incorporating various circuits and elements on the same substrate, obtain various advantages such as decrease in manufacturing costs, decrease in sizes of the display devices, increase in its yields, and decrease in its throughputs.

Further, research on the active matrix EL display device having an EL element as a self-light-emitting device (hereinafter referred to as EL display) is becoming more and more active. The EL display is referred to as an organic EL display (OELD) or an organic light-emitting diode (OLED).

The EL display is a self-light-emitting type unlike a liquid crystal display device. The EL element is constituted in such a manner that an EL layer is sandwiched between a pair of electrodes. However, the EL layer normally has a lamination structure. Typically, the lamination structure of a "hole transport layer/a light emitting/an electron transport layer" proposed by Tang et al. of the Eastman Kodak Company can be cited. This structure has a very high light-emitting efficiency, and this structure is adopted in almost all the EL displays which are currently subjected to research and development.

In addition, it may have a structure such that on the pixel electrode, a hole injection layer/a hole transport layer/a light emitting/ an electron transport layer, or a hole injection layer/a hole transport layer/a light emitting/an electron transport layer/an electron injection layer may be laminated in the stated order. Phosphorescent dye or the like may be doped into the light emitting.

In this specification, all of the layers provided between the pixel electrode and an opposite electrode are generally referred to as EL layers. Consequently, the hole injection layer, the hole transport layer, the light emitting, the electron transport layer, the electron injection layer and the like are all included in the EL layers.

A predetermined voltage is applied from a pair of electrodes to the EL layer of the above structure, with the result that recombination of carriers occurs in the light emitting layer to emit light. Note that in the present specification, emitting light by an EL element is referred to as driving the EL element. Besides, in the present specification, a light emitting element formed of an anode, an EL layer, and a cathode, is referred to as an EL element. Besides, a potential difference generated between an anode and a cathode of an EL element is referred to as an EL driver voltage.

FIG. 23 is a block diagram of a conventional multi gradation system EL display. The EL display shown in FIG. 23 uses TFTs formed on a substrate and includes a pixel portion 101, and a source signal side driver circuit 102 and a gate signal side driver circuit 103 which are disposed at the periphery of the pixel portion. An external switch 116 for controlling an EL driver voltage is connected to the pixel portion 101.

The source signal side driver circuit 102 fundamentally contains a shift register 102a, a latch (A) 102b, and a latch (B) 102c. Further, clock signals CK and start pulses SP are input to the shift register 102a, digital data signals are input to the latch (A) 102b, and latch signals are input to the latch (B) 102c.

The digital data signal input to the pixel portion 101 is formed by a time-division gradation data signal generation circuit 114. A video signal consisting of an analog signal or digital signal (a signal containing image information) is converted into a digital data signal for performing time-division gradation in the time-division gradation data signal generation circuit 114. At the same time, timing pulses necessary for performing time-division gradation display are generated in this circuit.

Specifically, the time-division gradation data signal generation circuit 114 contains means for: dividing one frame period into a plurality of subframe periods corresponding to n-bit (where n is an integer equal to or greater than 2) gradations; selecting write-in periods and display periods in the plurality of subframe periods; and setting the length of the display periods.

As the structure of the pixel portion 101, what is shown in FIG. 18 has been general. In FIG. 18, gate signal lines (G1 to Gn) for inputting gate signals and source signal lines (also referred to as data signal lines) (S1 to Sn) for inputting digital data signals are provided in the pixel portion 101. Note that the digital data signal means a digital video signal.

Besides, power source supply lines (V1 to Vn) are provided in parallel with the source signal lines (S1 to Sn). The potential of the power source supply line (V1 to Vn) is referred to as a power source potential. Besides, wiring lines (Vb1 to Vbn) are provided in parallel with the gate lines (G1 to Gn). The wiring lines (Vb1 to Vbn) are connected to the external switch 116.

A plurality of pixels 104 are arranged in matrix form in the pixel portion 101. FIG. 19 is an enlarged view of the pixel 104. In FIG. 19, reference numeral 1701 designates a TFT (hereinafter referred to as a switching TFT) functioning as a switching element; 1702, a TFT (hereinafter referred to as an EL driving TFT) functioning as an element (current control element) for controlling a current supplied to an EL element 1703; and 1704, a capacitor (holding capacitance).

A gate electrode of the switching TFT 1701 is connected to a gate signal line 1705 of one of the gate signal lines (G1 to Gn) for inputting gate signals. One of a source region and a drain region of the switching TFT 1701 is connected to a source signal line 1706 of one of the source signal lines (S1 to Sn) for inputting digital data signals, and the other is connected to a gate electrode of the EL driving TFT 1702 and the capacitor 1704, respectively.

One of a source region and a drain region of the driving TFT 1702 is connected to a power source supply line 1707 of one of the power source supply lines (V1 to Vn), and the other is connected to the EL element 1703. The capacitor 1704 is connected to the power source supply line 1707 of one of the power source supply lines (V1 to Vn).

The EL element 1703 is formed of an anode, a cathode, and an EL layer provided between the anode and the cathode. In the case where the anode is connected to the source region or the drain region of the EL driving TFT 1702, in other words, in the case where the anode is a pixel electrode, the cathode becomes an opposite electrode. On the contrary, in the case where the cathode is connected to the source region or the drain region of the EL driving TFT 1702, in other words, in the case where the cathode is a pixel electrode, the anode becomes an opposite electrode. In the present specification, the potential of the opposite electrode is referred to as an opposite potential. A potential difference between the potential of the opposite electrode and the potential of the pixel electrode is referred to as an EL driver voltage, and this EL driver voltage is applied to the EL layer.

The opposite electrode of the EL element is connected to the external switch 116 through one of the wiring lines (Vb1 to Vbn) (FIG. 18).

Next, driving of a multi-gradation system EL display will be described. Here, $2^n$ gradation display by an n-bit digital driving system will be described.

FIG. 5 shows a timing chart in digital system time-division gradation display of the multi-gradation system EL display. First, one frame period is divided into n subframe periods ($SF_1$ to $SF_n$). Note that a period in which all pixels of the pixel portion display one picture image is referred to as one frame period (F). A period obtained by dividing one frame period is referred to as a subframe period. As the number of gradations becomes large, the number of divisions of one frame period also becomes large, and a driver circuit must be driven by a high frequency.

One subframe period is divided into a write-in period (Ta) and a display period (Ts). The write-in period is a period in which digital data signals are inputted to all pixels in one subframe period. The display period (also referred to as a lighting period) is a period in which an emission or non-emission state of the EL element is selected and a display is performed.

Besides, an EL driver voltage shown in FIG. 5 indicates an EL driver voltage of an EL element in which the emission state is selected. That is, the EL driver voltage (FIG. 5) of the EL element in which the emission state is selected becomes 0 V during the write-in period, and has such magnitude, during the display period, that the EL element emits light.

An opposite potential is controlled by the external switch 116. In the write-in period, the opposite potential is kept equal to the power source potential, and in the display period, there is generated such a potential difference (ground in FIG. 18) that the EL element emits light, between the opposite potential and the power source potential.

First, the write-in period and the display period of each subframe will be described using the symbols of FIGS. 18 and 19, and thereafter, the time-division gradation display will be described.

First, a gate signal is inputted to the gate signal line G1, and all switching TFTs 1701 connected to the gate signal line G1 are turned on. A digital data signal is sequentially inputted to the source signal line (S1 to Sn). The opposite potential is kept equal to the power source potential of the power source supply line (V1 to Vn). The digital data signal includes information of "0" or "1". The digital data signal of "0" or "1" means a signal having a voltage of Hi or Lo, respectively.

The digital data signal inputted to the source signal line (S1 to Sn) is inputted to the gate electrode of the EL driving TFT 1702 through the switching TFT 1701 which is in an ON state. The digital data signal is also inputted to the capacitor 1704 and is held.

Gate signals are sequentially inputted to the gate signal lines G2 to Gn, so that the foregoing operation is repeated, the digital data signals are inputted to all pixels, and the inputted digital data signals are held in the respective pixels. A period in which digital data signals are inputted to all pixels, is referred to as the write-in period.

When the digital data signals are inputted to all pixels, all switching TFTs 1701 are turned off. By the external switch connected to the opposite electrode, such a potential difference that the EL element emits light is generated between the opposite potential and the power source potential.

In the case where the digital data signal includes the information of "0", the EL driving TFT 1702 is turned off, and the EL element 1703 does not emit light. On the contrary, in the case where the digital data signal includes the information of "1", the EL driving TFT 1702 is turned on. As a result, the pixel electrode of the EL element 1703 is held the power source potential, and the EL element 1703 emits light. Like this, according to the information which the digital data signal includes, the emission or non-emission state of the EL element is selected, and every pixel performs a display at the same time, so that a picture image is formed. A period in which a pixel performs a display is referred to as the display period.

The lengths of write-in periods ($Ta_1$ to $Ta_n$) of the n subframe periods ($SF_1$ to $SF_n$), respectively, are all constant. The display periods (Ts) of each of the subframe periods ($SF_1$ to $SF_n$) become display periods ($Ts_1$ to $Ts_n$).

The length of the display periods is set so as to become $Ts_1: Ts_2: Ts_3: \ldots : Ts_{(n-1)}: Ts_n = 2^0 : 2^{-1} : 2^{-2} : \ldots : 2^{-(n-2)} : 2^{-(n-1)}$. Note that $SF_1$ to $SF_n$ may appear in any order. A desired gradation display, from among the $2^n$ gradations, can be performed by combining the display periods.

The display period is any period from $Ts_1$ to $Ts_n$. Predetermined pixels are turned on for the $Ts_{n1}$ period here.

The write-in period again begins, and after the data signal is input to all of the pixels, the display period begins. Any of the periods $Ts_1$ to $Ts_{(n-1)}$ becomes the display period at this point. Predetermined pixels are turned on during the $Ts_{(n-1)}$ period here.

Similar operations are repeated in the remaining (n−2) subframe periods, $Ts_{(n-2)}, Ts_{(n-3)}, \ldots$, and $Ts_1$ are set, in order, to be the display period, and predetermined pixels are turned on in the respective subframe periods.

One frame period is complete after the appearance of the n subframe periods. By adding up the lengths of the display periods in which the pixel is turned on, the gradation of that pixel is determined. For example, when n=8, and the brightness for a case of the pixel emitting light during all of the display periods is taken as 100%, when the pixel emits light in $Ts_1$ and $Ts_2$, then a brightness of 75% can be expressed, and when $Ts_3, Ts_5$, and $Ts_8$ are selected, a brightness of 16% can be expressed.

With respect to the foregoing multi-gradation system EL display device, in the case where the size of the EL display device is made large, the number of pixels is increased, and a large current flows through the EL display device. Since this current flows through the external switch for controlling the EL driver voltage, high current power is required for the external switch for controlling the EL driver voltage.

In the EL display device, in the case where a light emission amount of 200 cd/m² is obtained, a current of several mA/cm² is required. For example, in the case where an EL material of 5 mA/cm² is used and a display device of 40 inches is formed, a current value necessary for a display becomes about 25 A, which is a considerable value.

In general, a predetermined standard of current power is determined for an external switch, and the upper limit of this current power has prevented enlargement of the multi-gradation system EL display device.

Besides, in the foregoing multi-gradation system EL display device, as the number of gradations becomes large, the number of divisions of one frame period is also increased, and a driver circuit must be driven by a high frequency. On the other hand, there is a tendency in that an external switch frequency characteristic is deteriorated as the current power becomes high. As a result, there has been a problem in that as the size of the multi-gradation system EL display device is enlarged, the frequency characteristic is deteriorated, and the number of possible gradations is decreased.

SUMMARY OF THE INVENTION

The present invention has an object to provide means for solving the problems associating with an enlargement of an EL display device. That is, an object of the present invention is to remove limitation of a current value due to an external switch for controlling an EL driver voltage, to prevent a deterioration in the frequency characteristic of an EL driver circuit due to the external switch for controlling the EL driver voltage, and to prevent a decrease in the number of gradations.

As means for solving the above problems, according to the present invention, a TFT is newly provided between one of a source region and a drain region of an EL driving TFT which is not connected to a power source supply line and an EL element. One of a source region and a drain region of the TFT is connected to the EL driving TFT and the other is connected to the EL element, respectively. A gate electrode is connected to an external switch through a wiring line. The TFT functions as a switching element for controlling an EL driver voltage (hereinafter referred to as a power source controlling TFT).

According to the above structure, a control method of an EL driver voltage using the power source controlling TFT is a voltage driving system, and a current hardly flows through the external switch connected to the gate electrode of the power source controlling TFT. Thus, in the external switch connected to the gate electrode of the power source controlling TFT, limitation of a current value does not become a problem, and a deterioration in a frequency characteristic is almost neglected.

With the above structure, it becomes possible to control an EL driver voltage through the external switch connected to the gate electrode of the power source controlling TFT, and it becomes possible to remove a conventional external switch, connected to an opposite electrode, for controlling an EL driver voltage. Thus, it becomes possible to remove the limitation of a current value of an EL driver circuit due to the external switch connected to the opposite electrode, and it becomes possible to prevent the deterioration in a frequency characteristic due to the external switch connected to the opposite electrode and to prevent the decrease in the number of gradations.

Note that the power source controlling TFT can be formed at the same time as a switching TFT and an EL driving TFT.

The structure of the present invention will be described below.

According to the present invention, there is provided an electric device comprising a plurality of source signal lines, a plurality of gate signal lines, a plurality of power source supply lines, a plurality of power source control lines, and a plurality of pixels, characterized in that
    each of the plurality of pixels includes a switching TFT, an EL driving TFT, a power source controlling TFT, and an EL element, and
    the power source controlling TFT controls a potential difference between a cathode and an anode of the El element.

According to the present invention, there is provided an electric device comprising a plurality of source signal lines, a plurality of gate signal lines, a plurality of power source supply lines, a plurality of power source control lines, and a plurality of pixels, characterized in that
    each of the plurality of pixels includes a switching TFT, an EL driving TFT, a power source controlling TFT, and an EL element,
    a period in which the EL element emits light in on frame period is controlled by use of a digital data signal, and
    the power source controlling TFT controls a potential difference between a cathode and an anode of the El element.

According to the present invention, there is provided an electric device comprising a plurality of source signal lines, a plurality of gate signal lines, a plurality of power source supply lines, a plurality of power source control tines, and a plurality of pixels, characterized in that
    each of the plurality of pixels includes a switching TFT, an EL driving TFT, a power source controlling TFT, and an EL element;
    one frame period includes n subframe periods $SF_1$, $SF_2$, ..., $SF_n$;
    the n subframe periods include write-in periods $Ta_1$, $Ta_2$, ..., $Ta_n$ and display periods $Ts_1$, $Ts_2$, ..., $Ts_n$;
    digital data signals are inputted to all of the plurality of pixels in the write-in periods $Ta_1$, $Ta_2$, ..., $Ta_n$;
    whether or not the plurality of EL elements emit light in the display periods $Ts_1$, $Ts_2$, ..., $Ts_n$ is selected by the digital data signals;
    lengths of the write-in periods $Ta_1$, $Ta_2$, ..., $Ta_n$ are all identical;
    a ratio of lengths of the display periods Ts1, Ts2, ..., $Ts_n$ is expressed by $2^0:2^{-1}: \ldots :2^{-(n-1)}$; and
    the power source controlling TFT controls a potential difference between a cathode and an anode of the El element.

An electric device according to the present invention may have such a structure that one of a source region and a drain region of the switching TFT is connected to one of the plurality of source signal lines, and the other is connected to a gate electrode of the EL driving TFT;
    one of a source region and a drain region of the EL driving TFT is connected to one of the plurality of power source supply lines and the other is connected to one of a source region or a drain region of the power source controlling TFT;
    the other of the source region and the drain region of the power source controlling TFT is connected to one of a cathode or an anode of the EL element; and
    a gate electrode of the power source controlling TFT is connected to one of the plurality of power source control lines.

An electric device according to the present invention may have such a structure that one of a source region and a drain region of the switching TFT is connected to one of the plurality of source signal lines, and the other is connected to a gate electrode of the EL driving TFT;

one of a source region and a drain region of the EL driving TFT is connected to one of a source region or a drain region of the power source controlling TFT, and the other is connected to one of a cathode or an anode of the EL element;

the other of the source region or the drain region of the power source controlling TFT is connected to one of the plurality of power source supply lines, and a gate electrode of the power source controlling TFT is connected to one of the plurality of power source control lines.

An electric device according to the present invention may include a capacitor between a gate electrode of the EL driving TFT and one of the plurality of power source supply lines.

An electric device according to the present invention may have such a structure that each of the plurality of EL elements includes an EL layer between the anode and the cathode, and the EL layer is made of one of a low molecular organic material or a polymer organic material.

An electric device according to the present invention may have such a structure that the low molecular organic material is one selected from the group consisting of $Alq_3$ (tris-8-quinolilite-aluminum) or TPD (triphenyl amine derivative).

An electric device according to the present invention may have such a structure that the polymer organic material is one selected from the group consisting of PPV (polyphenylenevinylene), PVK (polyvinylcarbazole), or polycarbonate.

An electric device according to the present invention may have such a structure that one frame period is 1/60s or less.

An electric device according to the present invention may be a computer, a video camera, or a DVD player characterized by using an electric device described above.

The electric device including the EL element referred to in this specification includes a triplet-based light emission device and/or a singlet-based light emission device.

BRIEF DESCRIPTION OF THE DRAWINGS

FIGS. 13A to 13E are views showing a fabricating process of an EL display of Embodiment 10;

FIGS. 16A to 16C are views showing the fabricating process of the EL display of Embodiment 10;

DETAILED DESCRIPTION OF THE PREFERRED EMBODIMENTS

[Embodiment Mode]

Figure 1:
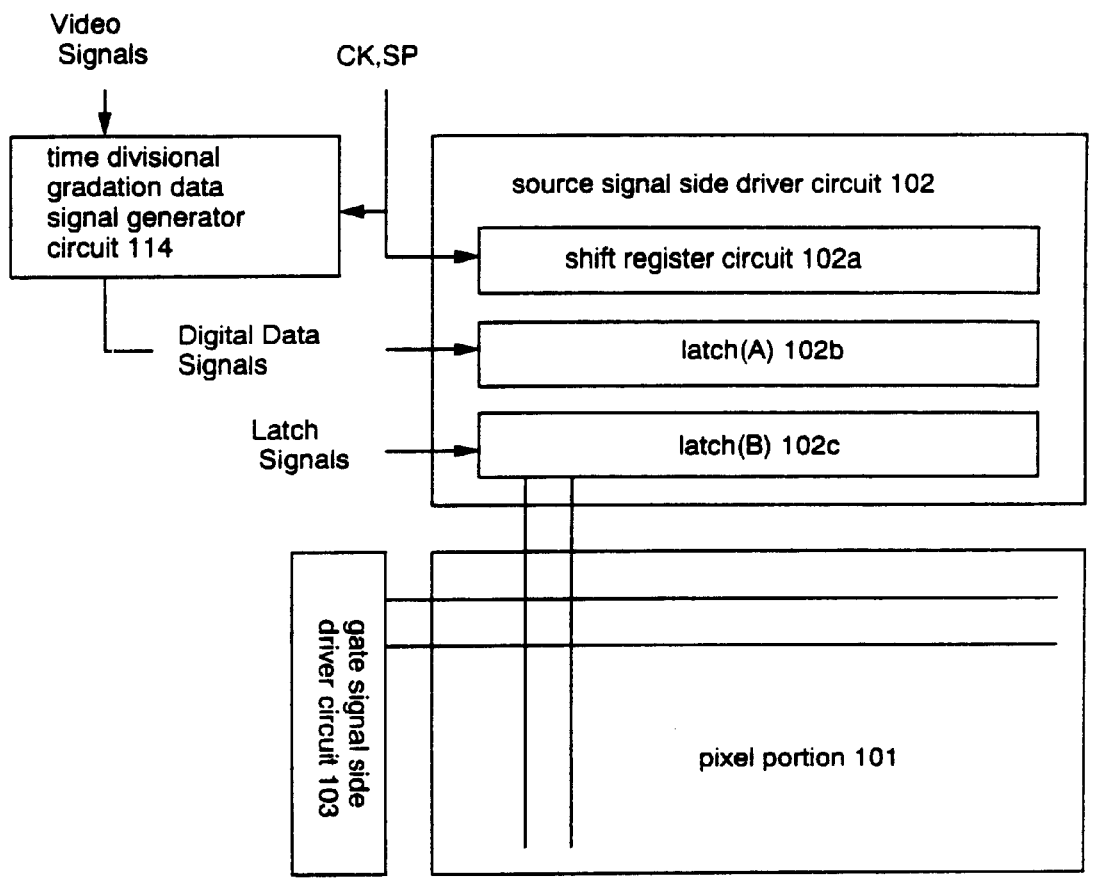
FIG. 1 is a view showing a circuit structure of an EL display of the present invention.

FIG. 1 is a block diagram of an EL display of the present invention. The EL display shown in FIG. 1 uses TFTs formed on a substrate and includes a pixel portion 101, and a source signal side driver circuit 102 and a gate signal side driver circuit 103 which are arranged at the periphery of the pixel portion. Besides, a low electric power external switch 117 for controlling an EL driver voltage is connected to the pixel portion 101. Although the block diagram of the EL display shown in FIG. 1 is the same as a conventional one in structure, the low electric power external switch 117 connected to the pixel portion 101 is essentially different from a conventional external switch. Naturally, the structure of the pixel portion is also different from the prior art. Note that in this mode, although the EL display includes one source signal side driver circuit and one gate signal side driver circuit, in the present invention, two source signal side driver circuits may be provided. Besides, two gate signal side driver circuits may also be provided.

The source signal side driver circuit 102 fundamentally contains a shift register 102a, a latch (A) 102b, and a latch (B) 102c. Further, clock signals CK and start pulses SP are input to the shift register 102a, digital data signals are input to the latch (A) 102b, and latch signals are input to the latch (B) 102c.

The digital data signal input to the pixel portion 101 is formed by a time-division gradation data signal generation circuit 114. A video signal consisting of analog signal or digital signal (a signal containing image information) is converted into a digital data signal for performing time-division gradation in the time-division gradation data signal generation circuit. At the same time, timing pulses necessary for performing time-division gradation display are generated in this circuit.

Specifically, the time-division gradation data signal generation circuit 114 contains means for: dividing one frame period into a plurality of subframe periods corresponding to n-bit (where n is an integer equal to or greater than 2) gradations; selecting write-in periods and display periods in the plurality of subframe periods; and setting the length of the display periods.

The time-division gradation data signal generation circuit 114 may be formed externally to the EL display of the present invention. In this case, it becomes a structure in which the digital data signals formed externally are input to the EL display of the present invention. An electronic equipment (an EL display device) having the EL display of the present invention as a display will then contain the EL display of the present invention and the time-division gradation data signal generation circuit as separate components.

Further, the time-division gradation data signal generation circuit 114 may also be implemented in the EL display of the present invention in a form such as an IC chip. In this case, it becomes a structure in which the digital data signals formed by the IC chip are input to the EL display of the present invention. The electronic apparatus having the EL display of the present invention as a display contains the EL display of the present invention, in which the IC chip containing the time-division gradation data signal generation circuit is implemented, as a component.

Furthermore, the time-division gradation data signal generation circuit 114 may be formed by TFTs on the same substrate as that on which the pixel portion 101, the source signal side driver circuit 102, and the gate signal side driver circuit 103 are formed. In this case, provided that the video signal containing image information is input to the EL display, all processing can be performed on the substrate. The time-division gradation data signal generation circuit may be formed by TFTs having a polysilicon film as an active layer. Further, the time-division gradation data signal generation circuit is built into the EL display itself for electronic apparatus having the EL display of the present invention as a display, and it is possible to miniaturize the electronic apparatus.

Figure 2:
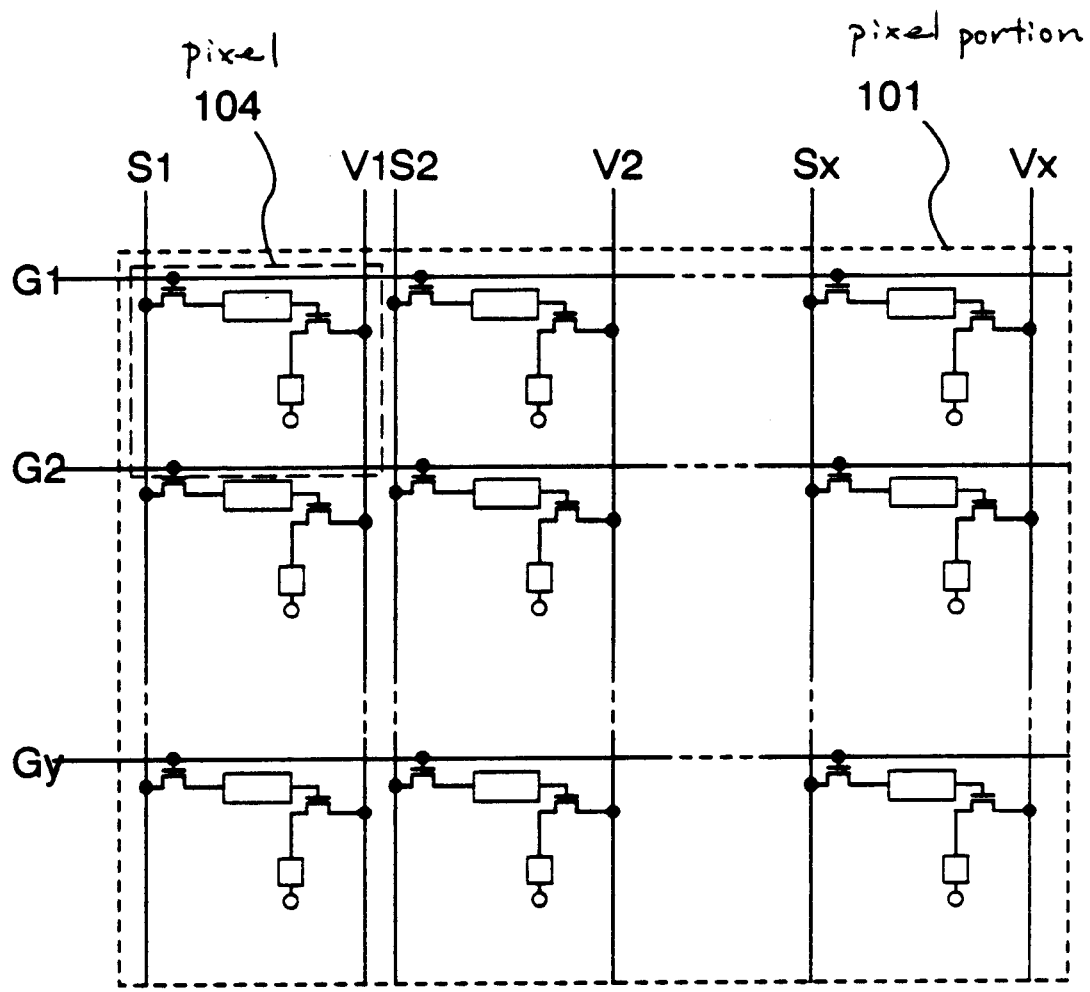
FIG. 2 is a circuit diagram of a pixel portion of an EL display of the present invention.

FIG. 2 shows a structure of the pixel portion 101. Gate signal lines (G1 to Gn) for inputting gate signals and source signal lines (also referred to as data signal lines) (S1 to Sn) for inputting digital data signals are provided in the pixel portion 101. Note that the digital data signal means a digital video signal.

Besides, power source supply lines (V1 to Vn) are provided in parallel with the source signal lines (S1 to Sn). The power source supply lines (V1 to Vn) may be provided in parallel with the gate signal lines (G1 to Gn). A potential of the power source supply line (V1 to Vn) is referred to as a power source potential.

Besides, power source control lines (C1 to Cn) are provided in parallel with the gate lines. The power source control lines (C1 to Cn) are connected to the external switch 117. The power source control lines (C1 to Cn) may be provided in parallel with the source lines.

Figure 3:
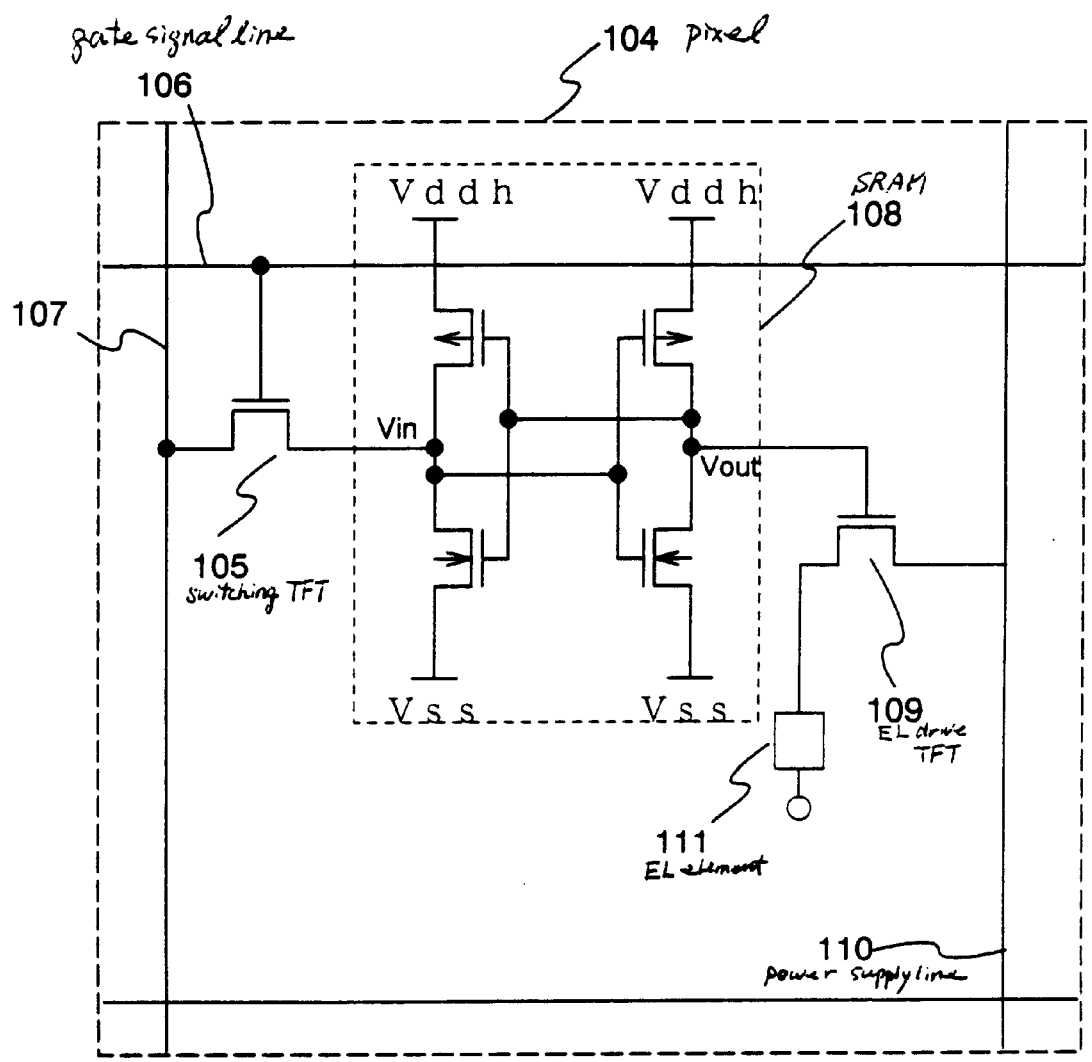
FIG. 3 is a circuit diagram of a pixel of an EL display of the present invention.

A plurality of pixels 104 are arranged in matrix form in the pixel portion 101. FIG. 3 is an enlarged view of the pixel 104. In FIG. 3, reference numeral 105 designates a switching TFT. A gate electrode of the switching TFT 105 is connected to a gate signal line 106 of one of the gate signal lines (G1 to Gn) for inputting the gate signals. One of a source region and a drain region of the switching TFT 105 is connected to a source signal line 107 of one of the source signal lines (S1 to Sn) for inputting the digital data signals, and the other is connected to a gate electrode of an EL driving TFT 109 and a capacitor 108, respectively. Note that in this mode, the capacitor 108 may not be provided.

One of a source region and a drain region of the EL driving TFT 109 is connected to a power source supply line 110 which is one of the power source supply lines (V1 to Vn), and the other is connected to a source region or a drain region of a power source controlling TFT 112. The other of the source region and the drain region of the power source controlling TFT 112 is connected to an EL element 111, and a gate electrode is connected to a power source control line 113 which is one of the power source control lines (C1 to Cn). The power source control lines (C1 to Cn) are connected to the low electric power external switch 117. The capacitor 108 is connected to the power source supply line 110 which is one of the power source supply lines (V1 to Vn).

The EL element 111 includes an anode, a cathode, and an EL layer provided between the anode and the cathode. In the case where the anode is connected to the source region or the drain region of the power source controlling TFT 112, in other words, in the case where the anode is a pixel electrode, the cathode becomes an opposite electrode. On the contrary, in the case where the cathode is connected to the source region or the drain region of the power source controlling TFT 112, in other words, in the case where the cathode is a pixel electrode, the anode becomes an opposite electrode. Note that in the present specification, the potential of the opposite electrode is referred to as an opposite potential. A potential difference between the potential of the opposite electrode and the potential of the pixel electrode is referred to as an EL driver voltage, and this EL driver voltage is applied to the EL layer.

Note that a resistor may be provided between the drain region or the source region of the power source controlling TFT 112 and the EL element 111. By providing the resistor, it becomes possible to control an amount of current supplied from the power source controlling TFT to the EL element and to prevent the influence of fluctuation in characteristics of the power source controlling TFT and the EL driving TFT. The resistor has only to be an element showing a resistant value sufficiently larger than the on resistance of the power source controlling TFT 112 and the EL driving TFT 109, and has no limitation in structure or the like. Note that the on resistance means a value obtained by dividing a drain voltage of a TFT, when the TFT is in an on state, by a drain current flowing at that time. The resistance value of the resistor may be selected in the range of 1 kΩ to 50 MΩ (preferably, 10 kΩ to 10 MΩ, more preferably, 50 kΩ to 1 MΩ. When a semiconductor layer having a high resistance value is used as the resistor, its formation is easy and such a semiconductor layer is preferable.

Driving of the EL display of the present invention is explained next. A case of performing $2^n$ gradation display in accordance with an n-bit digital driving method is explained here.

Figure 5:
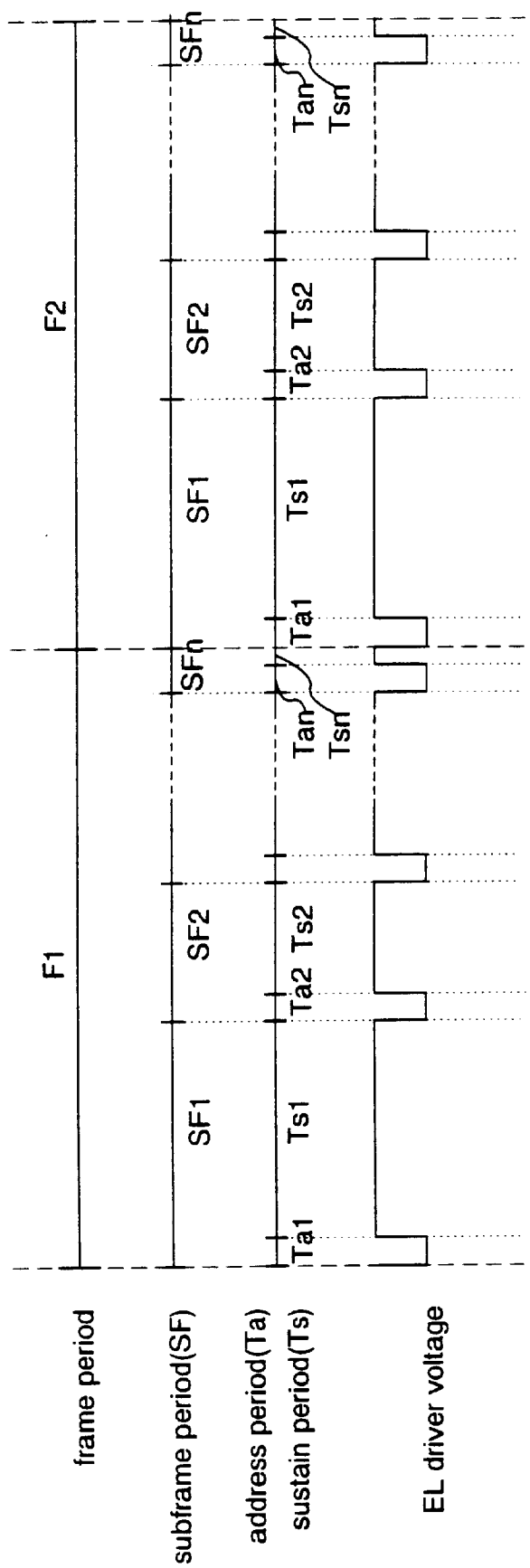
FIG. 5 is a timing chart showing a driving method of an EL display.

A timing chart during the time-division gradation display of the digital system of the EL display of the present invention is shown in FIG. 5. First, one frame period (F) is divided into n subframe periods ($SF_1$ to $SF_n$). Note that a period in which all of the pixels of the pixel portion display one image is referred to as one frame period (F). In a normal EL display the oscillation frequency is equal to or greater than 60 Hz. In other words, 60 or more frame periods are formed during one second, and 60 or more images are displayed during one second. If the number of images displayed during one second becomes fewer than 60, then problems such as image flicker start to become visually conspicuous. Note that a plurality of periods into which one frame period is additionally divided are referred to as subframe periods. As the number of gradations increases, the number of frame period divisions increases, and the driver circuit must be driven at a high frequency.

One subframe period is divided into a write-in period (Ta) and a display period (Ts). The write-in period is a period for inputting digital data signal into all of the pixels during one subframe period. The display period (also referred to as a turn on period) denotes a period for determining whether an EL element emits light or does not emit light, and for performing display.

The EL driver voltage shown in FIG. 5 indicates an EL driver voltage of the EL element in which the emission state is selected. That is, the EL driver voltage (FIG. 5) of the EL element in which the emission state is selected becomes 0 V in the write-in period, and has such magnitude, in the display period, that the EL element emits light.

In the present invention, the power source controlling TFT controls the EL driver voltage. More accurately, the EL driver voltage is controlled by the external switch connected to the power source controlling TFT through the power source control line. In the write-in period, the power source controlling TFT is in an off state, and the EL driver voltage becomes 0 V. In the display period, the power source controlling TFT is in an on state, and the EL driver voltage of the EL element in which the emission state is selected has such magnitude that the EL element emits light.

First, the write-in period and the display period of each subframe will be described in detail by use of symbols of FIGS. 2 and 3, and thereafter, time-division gradation display will be described.

First, in the write-in period, the power source controlling TFT 112 is in an off state, and an EL driver voltage is held 0 V. Note that although the EL driver voltage can have a minute value by a leak current caused by an off current (drain current flowing although a TFT as a switch is in an off state) of the EL driving TFT 109 or the power source controlling TFT 112, there is no problem if the value is so small that the EL element does not emit light. Then a gate signal is inputted to the gate signal line G1 and all switching TFTs 105 connected to the gate signal line G1 are turned on. Then digital data signals are inputted to the source signal lines (S1 to Sn). The digital data signal includes information of "0" or "1". The digital data signal of "0" or "1" means a signal having a voltage of Hi or Lo.

The digital data signal inputted to the source signal lines (S1 to Sn) is inputted to the gate electrode of the EL driving TFT 109 through the switching TFT 105 which is in the on state. In the case where the capacitor 108 exists, the digital data signal is inputted and is held in the same way.

Next, a gate signal is inputted to the gate signal line G2, and all switching TFTs 105 connected to the gate signal line G2 are turned on. Then digital data signals are inputted to the source signal lines (S1 to Sn).

The digital data signal inputted to the source signal lines (S1 to Sn) is inputted to the gate electrode of the EL driving TFT 109 through the switching TFT 105 which is in the on state. In the case where the capacitor 108 exists, the digital data signal is inputted and is held in the same way.

A gate signal is sequentially inputted to the gate signal lines G3 to Gn to repeat the foregoing operation, so that digital data signals are inputted to all pixels, and the inputted digital data signals are held in the respective pixels. A period in which digital data signals are inputted to all pixels is the write-in period.

At the same time as the end of the write-in period, the display period starts. When the display period starts, all switching TFTs 105 are turned off. Then the power source controlling TFT 112 is turned on by the low electric power external switch 117 connected to the power source control line 113, and the EL driver voltage of the EL element 111 in which the emission state is selected comes to have such magnitude that the EL element emits light.

In the case where the digital data signal includes information of "0", the EL driving TFT 109 is turned off, and the EL element 111 does not emit light. On the contrary, the digital data signal includes information of "1", the EL driving TFT 109 is turned on. At this time, since the power source controlling TFT 112 is also in the on state, the pixel electrode of the EL element 111 is kept at the same level as a power source potential, and the EL element 111 emits light. Like this, according to the information of the digital data signal, the emission or non-emission state of the EL element is selected, and every pixel performs a display at the same time. Every pixel performs a display, so that a picture image is formed. A period in which a pixel performs a display is referred to as the display period.

The length of all of the write-in periods ($Ta_1$ to $Ta_n$) which the n subframe periods ($SF_1$ to $SF_n$) respectively include are constant. The display periods which the subframe periods $SF_1$ to $SF_n$ respectively include are made $Ts_1$ to $Ts_n$, respectively.

The lengths of the display periods are set as to become $Ts_1:Ts_2:Ts_3: \ldots :Ts_{(n-1)}:Ts_n:2^0:2^{-1}: \ldots :2^{-(n-2)}:2^{-(n-1)}$. However, the sequence of appearance of $SF_1$ to $SF_n$ may be arbitrary. By the combination of the display periods, a desired gradation display among $2^n$ gradations can be performed.

The display period is any period from $Ts_1$ to $Ts_n$. Predetermined pixels are turned on for the $Ts_n$ period here.

The write-in period again begins, and after the data signal is input to all of the pixels, the display period begins. Any of the periods $Ts_1$ to $Ts_{(n-1)}$ becomes the display period at this point. Predetermined pixels are turned on during the $Ts_{(n-1)}$ period here.

Similar operations are repeated in the remaining n–2 subframe periods, $Ts_{(n-2)}$, $Ts_{(n-3)}$, . . . , and $Ts_1$ are set, in order, to be the display period, and predetermined pixels are turned on in the respective subframe periods.

One frame period is complete after the appearance of the n subframe periods. By adding up the lengths of the display periods in which the pixel is turned on, the gradation of that pixel is determined. For example, when n=8, and the brightness for a case of the pixel emitting light during all of the display periods is taken as 100%, when the pixel emits light in $Ts_1$ and $Ts_2$, then a brightness of 75% can be expressed, and when $Ts_3$, $Ts_5$, and $Ts_8$ are selected, a brightness of 16% can be expressed.

Note that in this embodiment of the invention, in the write-in period, since the power source controlling TFT is in the off state and the EL driver voltage is kept 0 V, the EL element does not emit light. However, the present invention is not limited to this structure. Such a modification may be made that the power source controlling TFT is kept the on state, and an EL driver voltage having such magnitude that the EL element emits light is always supplied to the EL element in which the emission state is selected, so that even in the write-in period, a display is made similarly to the display period. However, in this case, since the whole subframe period becomes a period in which light emission is actually made, the lengths of the subframe periods are set so as to become $SF_1:SF_2:SF_3 \ldots SF_{(n-1)}:SF_n==2^0:2^{-1}:2^{-2}: \ldots :2^{-(n-2)}:2^{-(n-1)}$. By the above structure, as compared with a driving method in which light emission is not made in the write-in period, a picture image of high brightness can be obtained.

In the present invention, by the above structure, it becomes possible to remove the limitation of a current value due to the conventional external switch for controlling the EL driver voltage. Besides, it becomes possible to prevent a deterioration in the frequency characteristic of the EL driver circuit due to the conventional external switch for controlling the EL driver voltage and to prevent a decrease in the number of gradations.

Note that the power source controlling TFT can be formed at the same time as the switching TFT and the EL driving TFT.

Hereinafter, embodiments of the present invention will be described.

[Embodiment 1]

In this embodiment, there will be explained a structure of a pixel of an EL display according to the present invention.

Figure 7A:
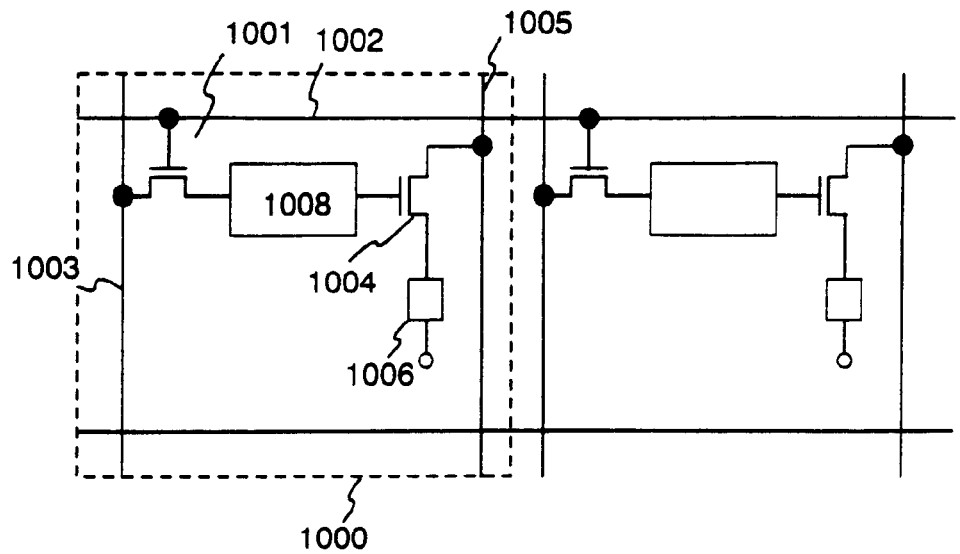
FIGS. 7A and 7B are circuit diagrams of pixel portions of an EL display of Embodiment 1.

On the pixel portion of the EL display according to the present invention, a plurality of pixels is arranged in a matrix-like configuration. FIG. 7A shows an example of a circuit diagram of the pixel.

In the pixel 1000, a switching TFT 1001 is provided in FIG. 7A. Note that, in the present invention, as a switching TFT 1001, either an n-channel type TFT or a p-channel type TFT may be used. In FIG. 7A, the n-channel type TFT is used as the switching TFT 1001.

The gate electrode of the switching TFT 1001 is connected to the gate signal line 1002 for inputting a gate signal. One of the source region and the drain region of the switching TFT 1001 is connected to the source signal line (also referred to as data signal line) 1003 for inputting a digital video signal while the other is connected to the gate electrode of the EL driver TFT 1004 or capacitor 1008. In this embodiment, the capacitor 1008 can be omitted.

The source region and the drain region of the EL driving TFT 1004 are connected to the power source supply line 1005 while the other is connected to the source region or the drain region of the power source control TFT 1009. One of the source region or the drain region of the power source control TFT 1009 is connected to the EL element 1006, while the gate electrode of the power source control TFT 1009 is connected to the power source control line 1010. And the capacitor 1008 is connected to power source supply line 1005.

The EL element 1006 comprises an anode, a cathode and an EL layer provided between the anode and the cathode. Note that, according to the present invention, in the case where the anode is a pixel electrode and the cathode is an opposite electrode, the source region or the drain region of the power source control TFT 1009 is connected to the anode of the EL element 1006. On the contrary, in the case where the anode is the opposite electrode and the cathode is the pixel electrode, the source region or the drain region of the power source control TFT 1009 is connected to the cathode of the EL element 1006. The opposite electrode of the EL element is always held predetermined electric potential.

Note that, as the EL driving TFT 1004 and the power source control TFT 1009, either n-channel type TFT or p-channel type TFT may be used. However, in the case where the anode of the EL element 1006 is the pixel electrode and the cathode is the opposite electrode, it is preferable that each of the EL driving TFT 1004 and the power source control TFT 1009 is the p-channel type TFT. Furthermore, on the contrary, in the case where the anode of the EL element 1006 is the opposite electrode, and the cathode is the pixel electrode, it is preferable that each of the EL driving TFT 1004 and the power source control TFT 1009 is an n-channel type TFT. In FIG. 7A, the p-channel type TFT is used as the EL driving TFT 1004 and the power source control TFT 1009. The anode of the EL element 1006 is the pixel electrode, and the cathode is the opposite electrode.

In a circuit diagram shown in FIG. 7A, the power source supply line 1005 is arranged in parallel with the source signal line 1003. And the power source control line 1010 is arranged in parallel with the gate signal line 1002.

Furthermore, an LDD region may be provided in the active layer of the EL driving TFT 1004, and a region (referred to as an Lov region) may be formed wherein the LDD region and the gate electrode are overlapped via the gate insulating film. When the EL driving TFT 1004 is either n-channel type TFT or p-channel type TFT, the Lov region is formed on the side of the drain region of the active layer, with the result that a capacity can be further formed between the gate electrode of the EL driving TFT 1004 and the Lov region, and the gate electrode of the EL driving TFT 1004 can be retained.

Note that, in the circuit diagram shown in FIG. 7A, either the switching TFT 1001, the EL driving TFT 1004 or the power source control TFT 1009 may be formed into a multi-gate structure (a structure including an active layer having two or more channel formation regions connected in series). By forming the switching TFT 1001 into a multi-gate structure, the off current can be decreased. Besides, in the case where the EL driving TFT 1004 or the power source control TFT 1009 are formed into a multi-gate structure, the deterioration of the EL driving TFT or the power source control TFT by heat can be suppressed.

In FIG. 7A, while the power source supply line 1005 and the source signal line 1003 are provided not overlapped each other, if they formed in different layer, they can be provided overlapped via insulating film. In this case, the pixel portion is more precisely, because the power source supply line 1005 and the source signal line 1003 own an exclusive area jointly.

In FIG. 7A, while the power source control line 1010 and the gate signal line 1002 are provided not overlapped each other, if they formed in different layer, they can be provided overlapped via insulating film. In this case, the pixel portion is more precisely, because the power source control line 1010 and the gate signal line 1002 own an exclusive area jointly.

Figure 7B:
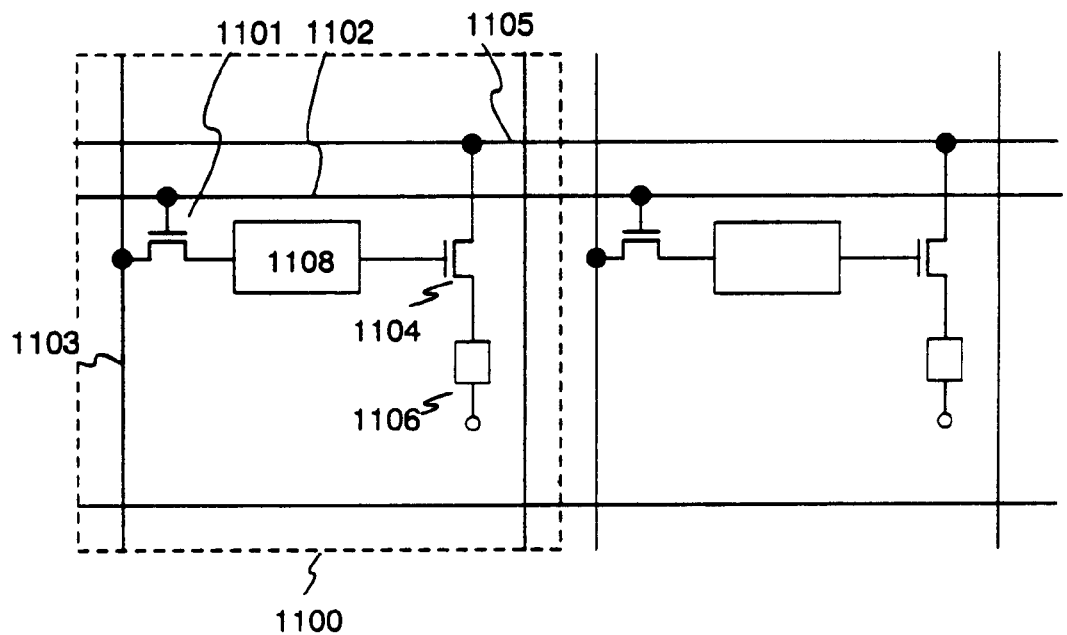

Next, FIG. 7B shows another example of the circuit diagram of the pixel according to the present invention. In FIG. 7B, the switching TFT 1101 is provided in the pixel 1100. Note that, in the present invention, either the n-channel type TFT or the p-channel type TFT may be used as the switching TFT 1101. In FIG. 7B, the n-channel type TFT is used as the switching TFT 1101. The gate electrode of the switching TFT 1101 is connected to the gate signal line 1102 for inputting the gate signal. One of the source region and the drain region of the switching TFT 1101 is connected to the source signal line (also referred to as a data signal line) 1103 for inputting a digital video signal while the other is connected to the gate electrode of the EL driving TFT 1104 and the capacitor 1108. In this embodiment, the capacitor 1108 can be omitted.

Then, one of the source region and the drain region of the EL driving TFT 1104 is connected to the power source supply line 1105 while the other is connected to the source region or the drain region of the power control TFT 1109. One of the source region and the drain region of the power source control TFT 1109 is connected to the EL element 1106, while the gate electrode of the power source control TFT 1109 is connected to the power source control line 1110. And the capacitor 1108 is connected to power source supply line 1105. The capacitor 1108 can be omitted.

The EL element 1106 comprises an anode, a cathode and an EL layer provided between the anode and the cathode. Note that, in the present invention, in the case where the anode is the pixel electrode and the cathode is the opposite electrode, the source region or the drain region of the power source control TFT 1109 is connected to the anode of the EL element 1106. On the contrary, in the case where the anode of the EL element 1106 is the opposite electrode and the cathode thereof is the pixel electrode, the source region or the drain region of the power control TFT 1109 is connected to the cathode of an EL element 1106. And the opposite electrode of an EL element is always held predetermined electric potential.

Note that, as the EL driving TFT 1104 and the power source control line 1109, either n-channel type TFT or p-channel type TFT may be used. However, in the case where the anode of the EL element 1106 is the pixel electrode and the cathode is the opposite electrode, it is preferable that each of the EL driving TFT 1104 and the power source control TFT 1109 is the p-channel type TFT. Furthermore, on the contrary, in the case where the anode of the EL element 1106 is the opposite electrode, and the cathode is the pixel electrode, it is preferable that each of the EL driving TFT 1104 and the power source control TFT 1109 is an n-channel type TFT. In FIG. 7B, the p-channel type TFT is used as each of the EL driving TFT 1104 and the power source control TFT 1109. The anode of the EL element 1106 is the pixel electrode, and the cathode is the opposite electrode.

In a circuit diagram shown in FIG. 7B, the power source supply line 1105 is arranged in parallel with the gate signal line 1102. And the power source control line 1110 is arranged in parallel with the source signal line 1103.

Besides, an LDD region may be provided in the active layer of the EL driving TFT 1104, and a region (referred to as an Lov region) may be formed wherein the LDD region and the gate electrode are overlapped via the gate insulating film. When the EL driving TFT 1104 is either n-channel type TFT or p-channel type TFT, the Lov region is formed on the side of the drain region of the active layer, with the result that a capacity can be further formed between the gate electrode of the EL driving TFT 1104 and the Lov region, and the gate electrode of the EL driving TFT 1104 can be retained.

Note that, in the circuit diagram shown in FIG. 7B, either the switching TFT 1101, the EL driving TFT 1104 and the power source control TFT 1109 may be formed into a multi-gate structure. By forming the switching TFT 1101 into a multi-gate structure, the off current of the switching TFT can be decreased. Besides, in the case where the EL driving TFT 1104 and the power source control TFT 1109 are formed into a multi-gate structure, the deterioration of the EL driving TFT by heat can be suppressed.

In FIG. 7B, while the power source supply line 1105 and the gate signal line 1102 are provided not overlapped each other, if they formed in different layers, they can be provided overlapped via insulating film. In this case, the pixel portion is more precisely, because the power source supply line 1105 and the gate signal line 1102 own an exclusive area jointly.

In FIG. 7B, while the power source control line 1110 and the source signal line 1103 are provided not overlapped each other, if they formed in different layers, they can be provided overlapped via insulating film. In this case, the pixel portion is more precisely, because the power source control line 1110 and the source signal line 1103 own an exclusive area jointly.

Figure 8A:
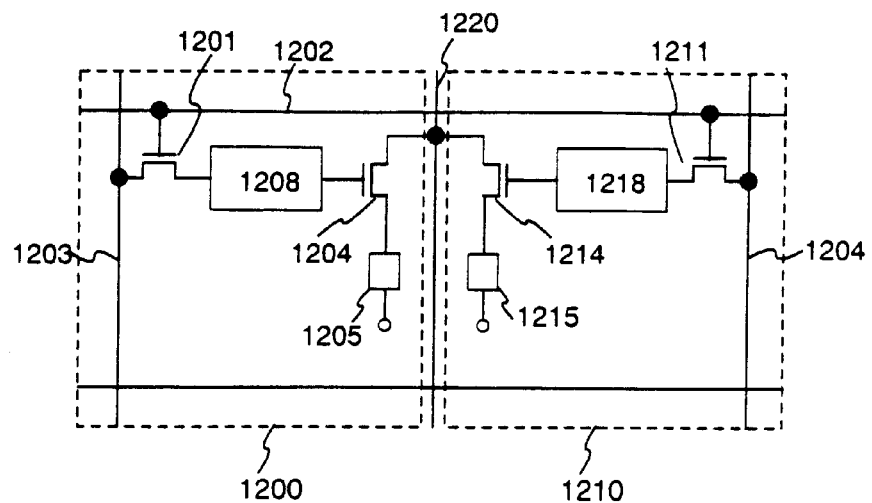
FIGS. 8A and 8B are circuit diagrams of pixel portions of an EL display of Embodiment 1.

Next, FIG. 8A shows another example of a circuit diagram of a pixel according to the present invention. In FIG. 8A, the pixel 1200 and the pixel 1210 are provided adjacent to each other. In FIG. 8A, reference numerals 1201 and 1211 denote switching TFTs. Note that, in the present invention, as switching TFTs 1201 and 1211 either the n-channel type TFT or the p-channel type TFT may be used. In FIG. 8A, the n-channel type TFT is used in each of the switching TFT 1201 and the switching TFT 1211. The gate electrodes of the switching TFTs 1201 and 1211 are connected to the gate signal line 1202 for inputting the gate signal. One of the source region and the drain region of the switching TFT 1201 is connected to the source signal line 1203 for inputting a digital video signal, while the other is connected the gate electrode of the EL driver TFT 1204 and the capacitor 1208, respectively. One of the source region and the drain region of the switching TFT 1211 is connected to the source signal line 1213 for inputting a digital video signal while the other is connected to the gate electrode of the EL driver TFT 1214 and the capacitor 1218, respectively. In this embodiment, the capacitors 1208 and 1218 can be omitted.

Then, ones of the source regions and the drain regions of the EL driving TFTs 1204 and 1214 are connected to the power source supply line 1220, while the other ones are connected to the source regions or the drain regions of the power source control TFT 1209 and 1219, respectively. The rest ones of the source regions and the drain regions of the power source control TFTs 1209 and 1219 are connected to the EL elements 1205 and 1215, respectively. The gate electrodes of the power source control TFT 1209 and 1219 are connected to the power source control line 1207. The capacitors 1208 and 1218 are connected to the power source supply line 1220. In this manner, in this embodiment, two adjacent pixels share one power source supply line 1220. As a consequence, as compared with the structure shown in FIG. 7A, number of the power source supply lines can be decreased. When the ratio of the wiring with respect to the whole pixel portion is small, the light shielding by the wiring can be suppressed in the case where the wiring is provided in a direction of the light emission of the EL layer.

Figure 8B:
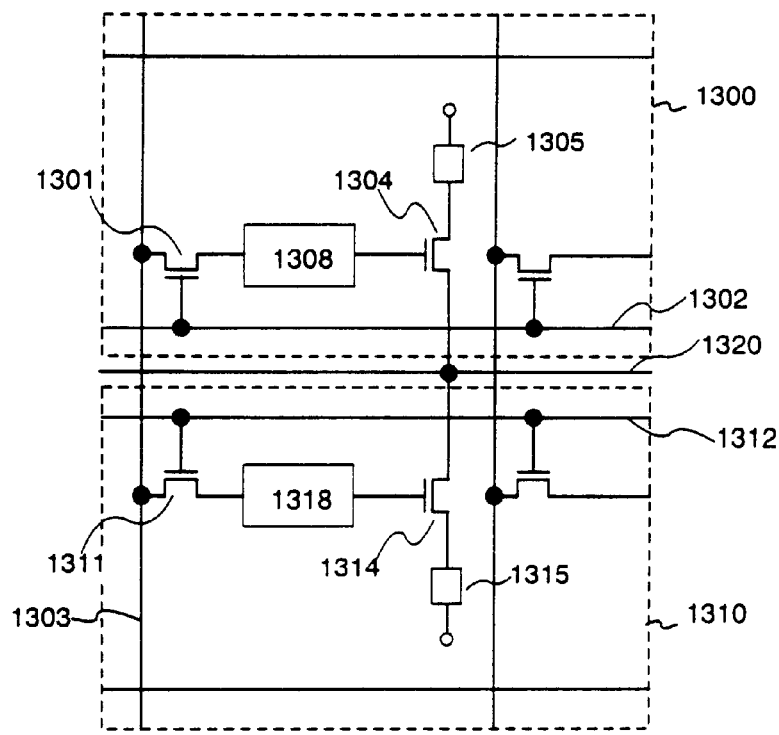

Next, FIG. 8B shows another example of a circuit diagram of a pixel according to the present invention. In FIG. 8B, the pixel 1300 and the pixel 1310 are provided adjacent to each other. In FIG. 8B, reference numerals 1301 and 1311 denote the switching TFTs. Note that, in the present invention, as the switching TFT 1301 and 1311, either the n-channel type TFT or the p-channel type TFT can be used. In FIG. 8B, the n-channel type TFT is used as each of the switching TFTs 1301 and 1311. The gate electrodes of the switching TFTs 1301 and the 1311 are connected to the gate signal lines 1302 and 1312 for inputting the gate signal, respectively. One of the source region and the drain region of the switching TFT 1301 is connected to the source signal line 1303 for inputting digital video signal, while the other is connected to the gate electrode of the EL driver TFT 1304 and the capacitor 1308. One of the source region or the drain region of the switching TFT 1311 is connected to the source signal line 1303 for inputting the digital video signal, while the other is connected to the gate electrode of the EL driver TFT 1314 and the capacitor 1318. In this embodiment, the capacitor 1308 and 1318 can be omitted.

Then, ones of the source regions and the drain regions of the EL driving TFTs 1304 and 1314 are connected to the power source supply line 1320, while the other ones are connected to the source regions or the drain regions of the power source control TFTs 1309 and 1319, respectively. Ones of the source regions and the drain regions of the power source control TFTs 1309 and 1319 are connected to the EL elements 1305 and 1315, respectively. The gate electrode of the power source control TFTs 1309 and 1319 are connected to the power source control line 1307. And the capacitors 1308 and 1318 are connected to the power source supply line 1320. In this manner, in this embodiment, two adjacent pixels share one power source supply line 1320. As a consequence, as compared with the structure shown in FIG. 7B, number of the power source supply lines can be decreased. When the ratio of the wiring with respect to the whole pixel portion is small, the light shielding by the wiring can be suppressed in the case where the wiring is provided in a direction of the light emission of the EL layer.

Figure 4A:
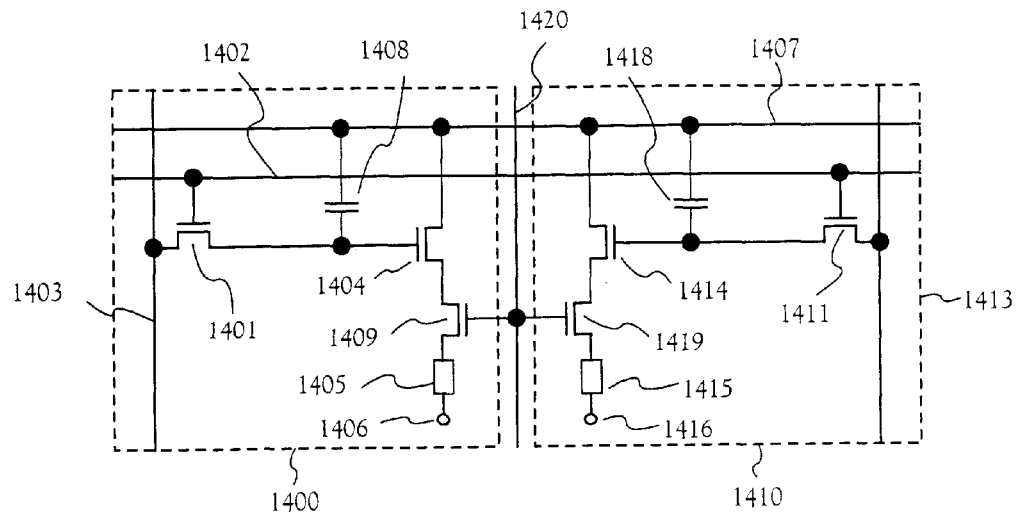
FIGS. 4A and 4B are circuit diagrams of pixel portions of an EL display of Embodiment 1.

Next, FIG. 4A shows another example of a circuit diagram of a pixel according to the present invention. In FIG. 4A, the pixel 1400 and the pixel 1410 are provided adjacent to each other. In FIG. 4A, reference numerals 1401 and 1411 denote the switching TFTs. Note that, in the present invention, as the switching TFT 1401 and 1411, either the n-channel type TFT or the p-channel type TFT can be used. In FIG. 4A, the n-channel type TFT is used as each of the switching TFTs 1401 and 1411. The gate electrodes of the switching TFTs 1401 and the 1411 are connected to the gate signal lines 1402 for inputting the gate signal. Ones of the source regions and the drain regions of the switching TFTs 1401 and 1411 are connected to the source signal lines 1403 and 1413 for inputting digital video signal, respectively, while the other ones are connected to the gate electrodes of the EL driver TFTs 1404 and 1414, the capacitors 1408 and 1418, respectively. In this embodiment, the capacitors 1408 and 1418 can be omitted.

Then, ones of the source regions and the drain regions of the EL driving TFTs 1404 and 1414 are connected to the power source supply line 1407 while the other ones are connected to the source regions or the drain regions of the power source control TFTs 1409 and 1419. The other ones of the source regions and the drain regions of the power source control TFTs 1409 and 1419 are connected to the EL elements 1405 and 1415. The gate electrodes of the power source control TFTs 1409 and 1419 are connected to the power source control line 1420. And the capacitors 1408 an 1418 are connected to the power source supply line 1407. In this manner, in this embodiment, two adjacent pixels share one power source control line 1420. As a consequence, as compared with the structure shown in FIG. 7B, number of the power source control lines can be decreased. When the ratio of the wiring with respect to the whole pixel portion is small, the light shielding by the wiring can be suppressed in the case where the wiring is provided in a direction of the light emission of the EL layer.

In a circuit diagram shown in FIG. 4A, the power source control line 1420 is arranged in parallel with the source signal lines 1403 and 1413. And the power source supply line 1407 is arranged in parallel with the gate signal line 1402.

Figure 4B:
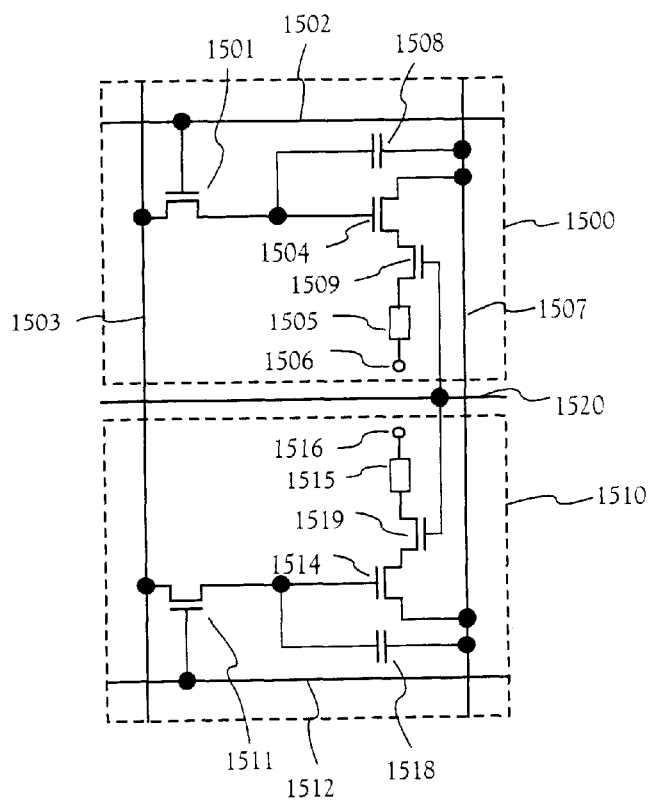

Next, FIG. 4B shows another example of a circuit diagram of a pixel according to the present invention. In FIG. 4B, the pixel 1500 and the pixel 1510 are provided adjacent to each other. In FIG. 4B, reference numerals 1501 and 1511 denote the switching TFTs. Note that, in the present invention, as the switching TFT 1501 and 1511, either the n-channel type TFT or the p-channel type TFT can be used. In FIG. 4B, the n-channel type TFT is used as each of the switching TFTs 1501 and 1511. The gate electrodes of the switching TFTs 1501 and 1511 are connected to the gate signal lines 1502 and 1512 for inputting the gate signal, respectively. Ones of the source regions and the drain regions of the switching TFTs 1501 and 1511 are connected to the source signal line 1503 for inputting digital video signal, while the other ones are connected to the gate electrodes of the EL driver TFTs 1504 and 1514, the capacitors 1508 and 1518, respectively. In this embodiment, the capacitors 1508 and 1518 can be omitted.

Then, ones of the source regions and the drain regions of the EL driving TFTs 1504 and 1514 are connected to the power source supply line 1507, while the other ones are connected to the source regions or the drain regions of the power source control TFTs 1509 and 1519, respectively. The other ones of the source regions and the drain regions of the power source control TFTs 1509 and the 1519 are connected to the EL elements 1505 and 1515, respectively. The gate electrodes of the power source control TFTs 1509 and 1519 are connected to the power source control line 1520. And the capacitors 1508 an 1518 are connected to the power source supply line 1507. In this manner, in this embodiment, two adjacent pixels share one power source control line 1520. As a consequence, as compared with the structure shown in FIG. 7A, number of the power source control lines can be decreased. When the ratio of the wiring with respect to the whole pixel portion is small, the light shielding by the wiring can be suppressed in the case where the wiring is provided in a direction of the light emission of the EL layer.

Figure 6A:
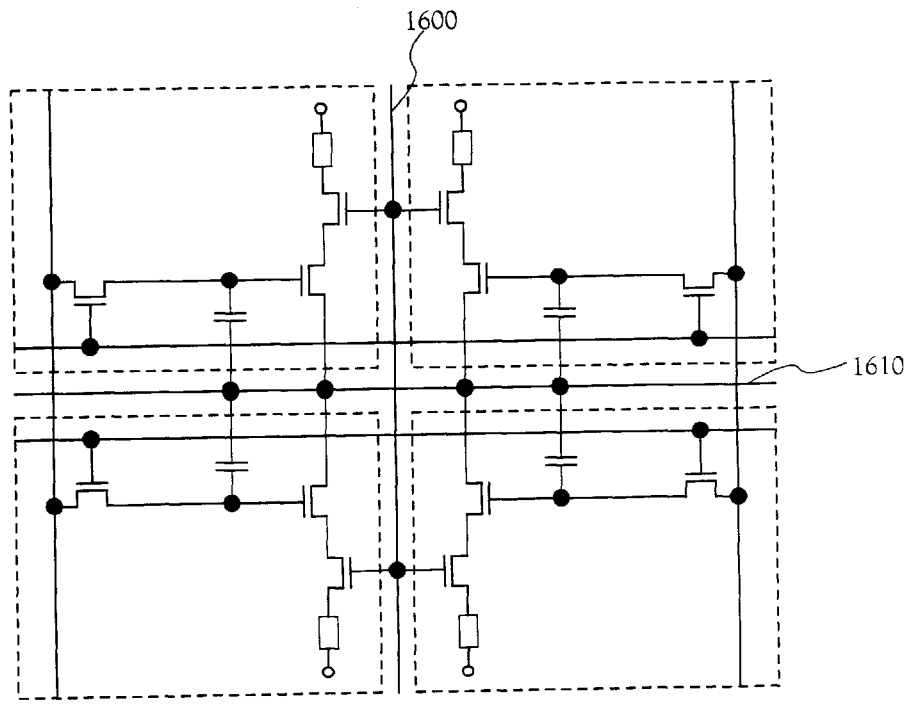
FIGS. 6A and 6B are circuit diagrams of pixel portions of an EL display of Embodiment 1.
Figure 6B:
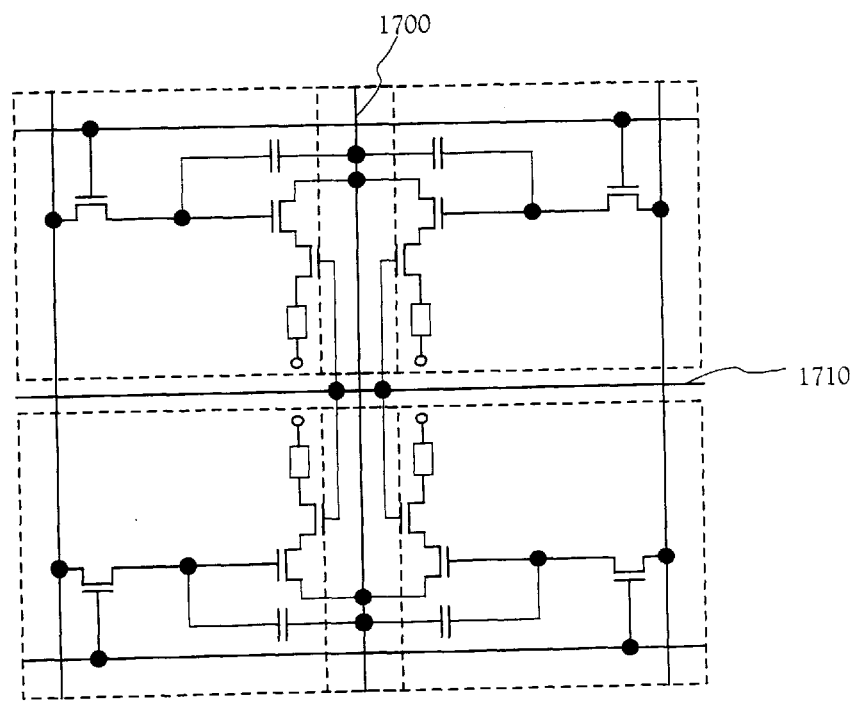

Next, the another example of the circuit diagram of the present invention is shown in FIG. 6A. In this embodiment, the two pixels shown in FIG. 4A and foregoing pixels which are turned at the power source supply line are arranged to share the power source supply line. FIG. 6B can be shown by the structure which is the two pixels and turning pixels at the power source control line are arranged to share the power source control line shown in FIG. 8B. The TFT structure and each elements' connection are according to an explanation of FIG. 4A and FIG. 8B.

As shown in FIG. 6A, two adjacent pixels indicated to the gate line share one power source control line 1600, and two adjacent pixels indicated to the source line share one power source supply line 1610. As a consequence, as compared with the structure shown in FIGS. 7A and 7B, the numbers of the power source control lines and the power source supply lines can be decreased. When the ratio of the wiring with respect to the whole pixel portion is small, the light shielding by the wiring can be suppressed in the case where the wiring is provided in a direction of the light emission of the EL layer.

The another example of the circuit diagram of the present invention is shown in FIG. 6B. In this embodiment, the two pixels shown in FIG. 8A and foregoing pixels which are turned at the power source supply line are arranged to share the power source supply line. FIG. 6B can be shown by the structure which is the two pixels and turning pixels at the power source supply line are arranged to share the power source supply line shown in FIG. 4B. The TFT structure and each elements' connection is according to an explanation of FIG. 8A or FIG. 4B.

As shown in FIG. 6B, two adjacent pixels indicated to the gate line share one power source supply line 1700, and two adjacent pixels indicated to the source line share one power source control line 1710. As a consequence, as compared with the structure shown in FIGS. 7A and 7B, the numbers of the power source control lines and the power source supply lines can be decreased. When the ratio of the wiring with respect to the whole pixel portion is small, the light shielding by the wiring can be suppressed in the case where the wiring is provided in a direction of the light emission of the EL layer.

Note that, in a circuit diagram shown in FIGS. 8A, 8B, 4A, 4B, 6A and 6B, the EL element comprises an anode, a cathode, and an EL layer provided between the anode and the cathode respectively. Note that, according to the present invention, in the case where the anode is the pixel electrode and the cathode is an opposite electrode, the source region or the drain region of the power source control TFT is connected to the anode of the EL element. On the contrary, in the case where the anode is the opposite electrode and the cathode is the pixel electrode, the source region or the drain region of the power source control TFT is connected to the cathode of the EL element. Further, the opposite electrode of the EL element is always held predetermined potential.

Note that, in a circuit diagram shown in FIGS. 8A, 8B, 4A, 4B, 6A and 6B, as the EL driving TFT and the power source control TFT are either the n-channel type TFT or the p-channel type TFT may be used. However, in the case where the anode of the EL element is a pixel electrode and the cathode thereof is an opposite electrode, it is preferable that the EL driving TFT and the power source control TFT are p-channel type TFTs. Besides, on the contrary, in the case where the anode of the EL element is an opposite electrode and the cathode thereof is a pixel electrode, it is preferable that the EL driving TFT and the power source control TFT are n-channel type TFTs. In FIGS. 8A, 8B, 4A, 4B, 6A and 6B, the p-channel type TFTs are used as the EL driving TFT and the power source control TFT, so that the anode of the EL element is the pixel electrode and the cathode thereof is the opposite electrode.

Note that, in a circuit diagram shown in FIGS. 8A, 8B, 4A, 4B, 6A and 6B, an LDD region is provided in the active layer of the EL driving TFT, so that a region (referred to as the Lov region) may be formed wherein the LDD region and the gate electrode are overlapped via the gate insulating film. When the EL driving TFT is either an n-channel type TFT or a p-channel type TFT, the Lov region is formed on the side of the drain region of the active layer, with the result that a capacity can be further formed between the gate electrode of the EL driving TFT and the Lov region, and the gate electrode of the EL driving TFT can be retained. .

Note that, in a circuit diagram shown in FIGS. 8A, 8B, 4A, 4B, 6A and 6B, one or more among the switching TFT, the EL driving TFT and the power source control TFT may be formed into a multi-gate structure. By forming the switching TFT into a multi-gate structure, the off current can be decreased. Besides, in the case where the EL driving TFT and the power source control TFT are formed into the multi-gate structure, the deterioration of the EL driving TFTs or the power source control TFT by heat can be suppressed.

Note that, in this embodiment, a resistor may be provided between the drain region or the source region of the current control TFT and the EL element. By providing the resistor, the quantity of current supplied from the power source control TFT to the EL element is controlled so that the influence of the characteristics of the power source control TFT and the EL driving TFT on the disparity may be prevented. The resistor may be an element showing a resistance value sufficiently larger than the on resistance of the power source control TFT and the EL driving TFT. Therefore, the structure or the like is not restricted. Note that, the on resistance is a value obtained by dividing the drain voltage of the TFT with the drain current which flows at that time when the TFT is turned on. As a resistance value of the resistor, any in the scope of 1 kΩ through 50 MΩ (preferably, 10 kΩ through 10 MΩ, or more preferably 50 kΩ through 1 MΩ) may be selected. When a semiconductor layer having a high resistance value as a resistor is used, the formation is easy and preferable.

[Embodiment 2]

In this embodiment, a structure of a pixel of an EL display of the present invention will be described.

In this embodiment, a power source controlling TFT is disposed between a EL driving TFT and a power source supply line. An example of a circuit diagram of a pixel is shown in FIG. 20A.

Figure 20A:
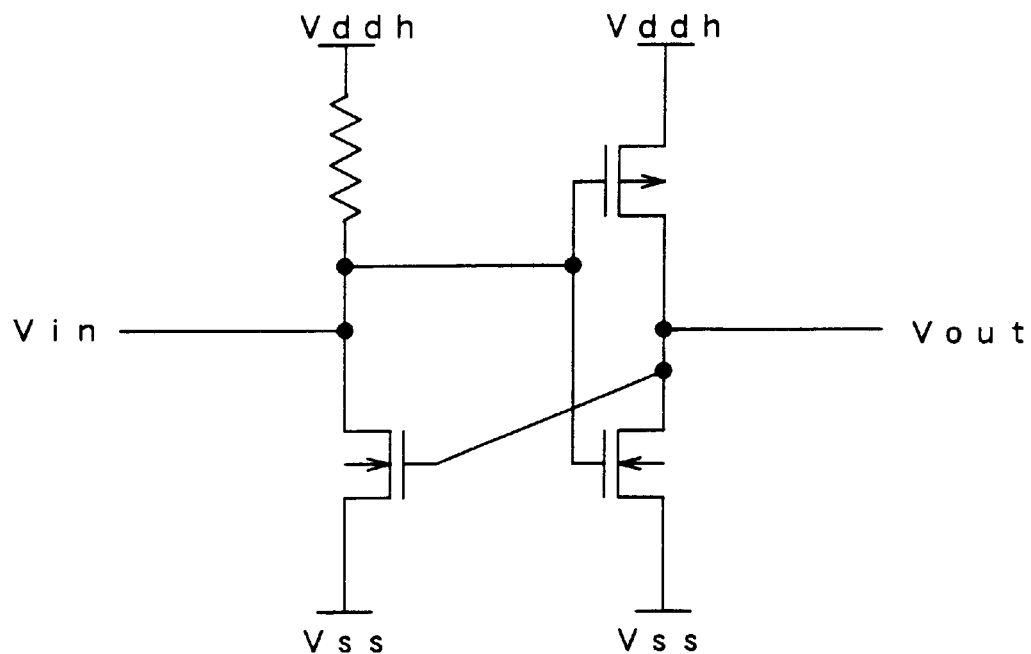
FIGS. 20A and 20B are circuit diagrams of pixel portions of an EL display of Embodiment 2.

In FIG. 20A, a switching TFT 1801 is provided in a pixel 1800. In the present invention, both an n-channel TFT and a p-channel TFT may be used for the switching TFT 1801. In this embodiment, in FIG. 20A, an n-channel TFT is used for the switching TFT 1801.

A gate electrode of the switching TFT 1801 is connected to a gate signal line 1802 to which a gate signal is inputted. One of a source region and a drain region of the switching TFT 1801 is connected to a source signal line (also referred to as data signal line) 1803 to which a digital video signal is inputted and the other is connected to a gate electrode of an EL driving TFT 1804 and a capacitor 1808.

One of a source region and a drain region of the EL driving TFT 1804 is connected to a source region or a drain region of a power source controlling TFT 1809, and the other is connected to an EL element 1806. The other of the source region or the drain region of the power source controlling TFT 1809 is connected to a power source supply line 1805, and a gate electrode of the power source controlling TFT 1809 is connected to a power source control line 1810. The capacitor 1808 is connected to the power source supply line 1805. In this embodiment, the capacitor 1808 may not be provided.

The EL element 1806 includes an anode, a cathode, and an EL layer provided between the anode and the cathode. Note that in the present invention, in the case where the anode is a pixel electrode and the cathode is an opposite electrode, the source region or the drain region of the EL driving TFT 1804 is connected to the anode of the EL element 1806. On the contrary, in the case where the anode is an opposite electrode and the cathode is a pixel electrode, the source region or the drain region of the EL driving TFT 1804 is connected to the cathode of the EL element 1806. The opposite electrode of the EL element is always kept at the level of a predetermined potential.

Although both an n-channel TFT and a p-channel TFT can be used for the EL driving TFT 1804 and the power source controlling TFT 1809, in the case where the anode of the EL element 1806 is a pixel electrode and the cathode is an opposite electrode, it is preferable that the EL driving TFT 1804 and the power source controlling TFT 1809 are p-channel TFTs. On the contrary, in the case where the anode of the EL element 1806 is an opposite electrode and the cathode is a pixel electrode, it is preferable that the EL driving TFT 1804 and the power source controlling TFT 1809 are n-channel TFTs. In FIG. 20A, p-channel TFTs are used for the EL driving TFT 1804 and the power source controlling TFT 1809, and the anode of the EL element 1806 is a pixel electrode and the cathode is an opposite electrode.

The circuit diagram shown in FIG. 20A can also be expressed in such a manner that in the circuit diagram shown in FIG. 7A (Embodiment 1), the power source controlling TFT 1009 disposed between the EL driving TFT 1004 and the EL element 1006 is removed, and a power source controlling TFT is newly disposed between the EL driving TFT 1004 and the power source supply line 1005. In this case, one of a source region and a drain region of the power source controlling TFT is connected to the power source supply line 1005, and the other is connected to the EL driving TFT 1004. Besides, a gate electrode is connected to the power source control line 1010.

Figure 20B:
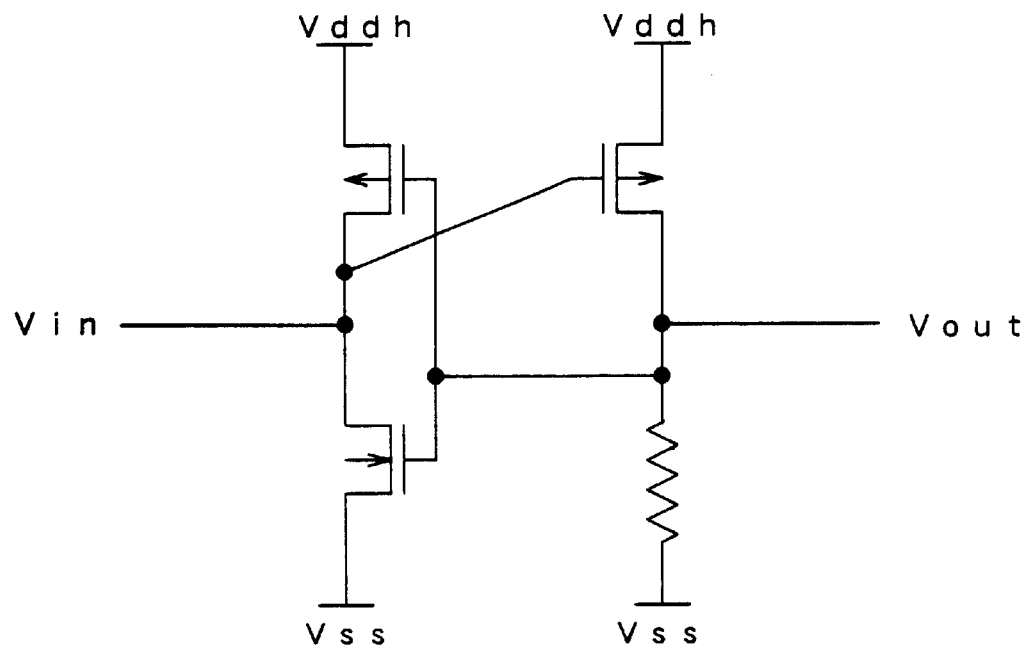

Next, another example of a circuit diagram of a pixel of the present invention is shown in FIG. 20B. The circuit diagram shown in FIG. 20B can be expressed in such a manner that in the circuit diagram shown in FIG. 7B (Embodiment 1), the power source controlling TFT 1109 disposed between the EL driving TFT 1104 and the EL element 1106 is removed, and a power source controlling TFT 1111 is newly disposed between the EL driving TFT 1104 and the power source supply line 1105. Note that one of a source region and a drain region of the power source controlling TFT is connected to the power source supply line 1105, and the other is connected to the EL driving TFT 1104. Besides, a gate electrode is connected to the power source control line 1110.

Like this, in this embodiment, the power source controlling TFT is disposed between the EL driving TFT and the power source supply line. In any case of the circuit diagrams of FIGS. 7A, 7B, 8A, 8B, 4A, 4B, 6A and 6B in the embodiment 1, when the power source controlling TFT disposed between the EL driving TFT and the EL element is removed, and the power source controlling TFT is newly disposed between the EL driving TFT and the power source supply line, the structure like this becomes feasible. Note that one of the source region and the drain region of the power source controlling TFT is connected to the power source supply line, and the other is connected to the EL driving TFT. The gate electrode is connected to the power source control line.

In this embodiment, an LDD region may be provided in an active layer of the EL driving TFT, and a region (referred to as Lov region) where the LDD region overlaps with the gate electrode through a gate insulating film may be formed. Even if the EL driving TFT is an n-channel TFT or a p-channel TFT, by forming the Lov region at the side of the drain region of the active layer, a capacitance can be formed between the gate electrode of the EL driving TFT and the Lov region, and the gate voltage of the EL driving TFT can be held.

The switching TFT, the EL driving TFT, or the power source controlling TFT may be made to have a multi-gate structure (structure including an active layer having two or more channel formation regions connected in series with each other). Making the switching TFT have the multi-gate structure, the off current of the switching TFT can be lowered. Besides, making the EL driving TFT or the power source controlling TFT have the multi-gate structure, deterioration of the EL driving TFT or the power source controlling TFT due to heat can be suppressed.

In the case where attention is paid to two lines parallel with each other among the power source supply line, the source signal line, the power source control line and the gate signal line, such a structure is adopted that both do not overlap with each other. However, if both are wiring lines formed in different layers, they may be provided so as to overlap with each other through an insulating film. In this case, since an occupied area can be made common to the two lines provided to overlap with each other, the pixel portion can be further made minute.

Note that in this embodiment, a resistor may be provided between the drain region or the source region of the EL driving TFT and the EL element. By providing the resistor, it becomes possible to control an amount of current supplied from the EL driving TFT to the EL element and to prevent the influence of fluctuation in the characteristics of the power source controlling TFT and the EL driving TFT. The resistor may be an element showing a resistance value sufficiently larger than the on resistance of the power source controlling TFT and the EL driving TFT, and has no limitation in structure or the like. Note that the on resistance means a value obtained by dividing a drain voltage of a TFT, when the TFT is in an on state, by a drain current flowing at that time. The resistance value of the resistor may be selected in the range of 1 kΩ to 50 MΩ (preferably, 10 kΩ to 10 MΩ, more preferably, 50 kΩ to 1 MΩ). When a semiconductor layer having a high resistance value is used as the resistor, its formation is easy and it is preferable.

[Embodiment 3]

An example of manufacturing an EL display using the present invention is explained in embodiment 3.

Figure 9A:
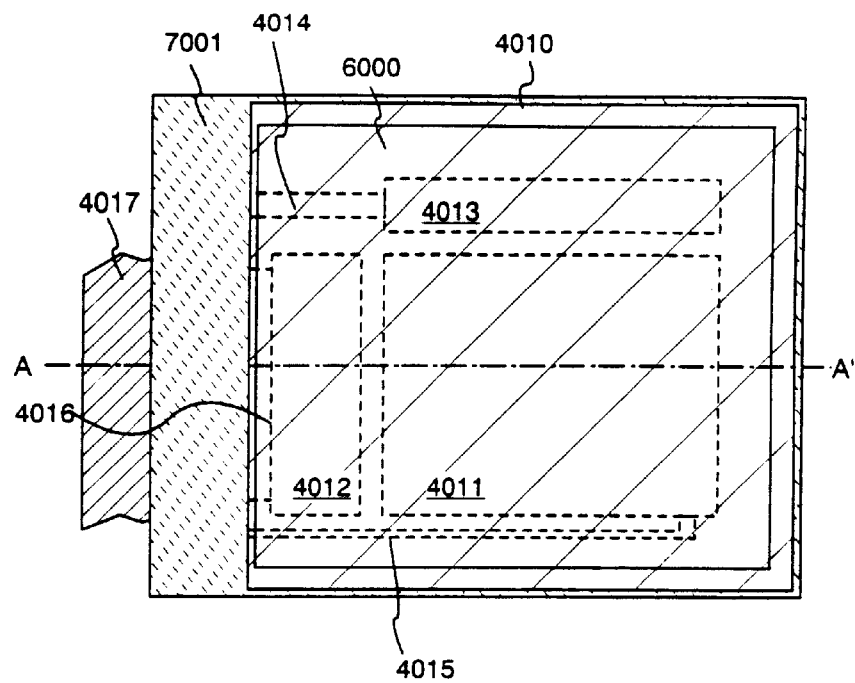
FIGS. 9A and 9B are a top view and a sectional view of an EL display of Embodiment 3.

FIG. 9A is a top view of an EL display device using the present invention. In FIG. 9A, reference numeral 4010 is a substrate, reference numeral 4011 is a pixel portion, reference numeral 4012 is a source signal side driver circuit, and reference numeral 4013 is a gate signal side driver circuit. The driver circuits are connected to external equipment, through an FPC 4017, via wirings 4014 to 4016.

A covering material 6000, a sealing material (also referred to as a housing material) 7000, and an airtight sealing material (a second sealing material) 7001 are formed so as to enclose at least the pixel portion, preferably both the driver circuits and the pixel portion, at this point.

Figure 9B:
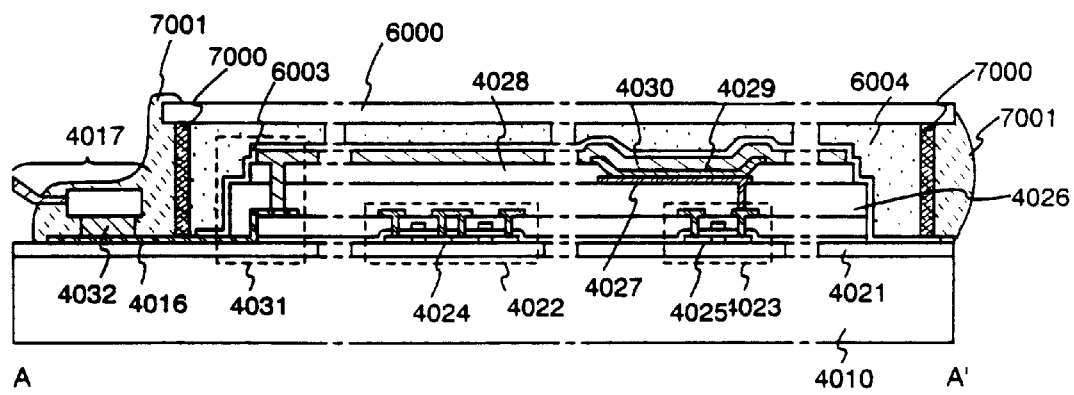

Further, FIG. 9B is a cross sectional structure of the EL display device of the present invention. A driver circuit TFT 4022 (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made from a resin material. The pixel electrode 4027 is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a methods of depositing the EL layer 4029 and the cathode 4030 continually under vacuum or forming the EL layer 4029 in an inert gas atmosphere and forming the cathode 4030 without the air exposure. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The cathode 4030 is then connected to the wiring 4016 in a region denoted by reference numeral 4031. The wiring 4016 is a power source supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of $\mu$m of aluminum foil is sandwiched by a PVF film or a Mylar film.

However, depending upon the light emission direction from the EL device (the light radiation direction), it is necessary for the covering material 6000 to have light transmitting characteristics.

Further, the wiring 4016 is electrically connected to the FPC 4017 through a gap between the airtight sealing material 7001 and the substrate 4010. Note that although an explanation of the wiring 4016 has been made here, the wirings 4014 and 4015 are also electrically connected to the FPC 4017 by similarly passing underneath and the sealing material 7000 and the airtight sealing material 7001.

In FIGS. 9A and 9B, the covering material 6000 is bonded after forming the filling material 6004, and the sealing material 7000 is attached so as to cover the lateral surfaces (exposed surfaces) of the filling material 6004, but the filling material 6004 may also be formed after attaching the covering material 6000 and the sealing material 7000. In this case, a filling material injection opening is formed through a gap formed by the substrate 4010, the covering material 6000, and the sealing material 7000. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Figure 10A:
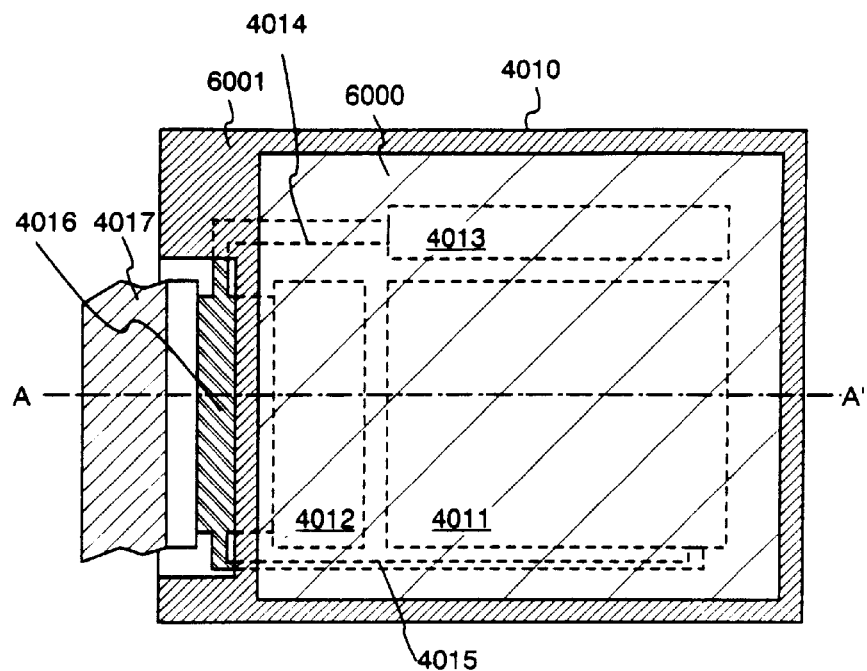
FIGS. 10A and 10B are a top view and a sectional view of an EL display of Embodiment 3.
Figure 10B:
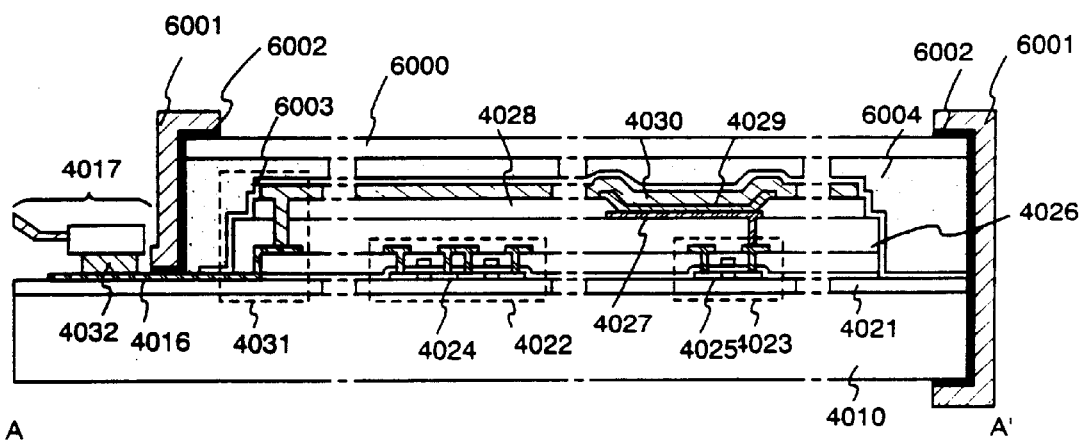

Next, an example of manufacturing an EL display device having a structure which differs from that of FIGS. 9A and 9B is explained using FIGS. 10A and 10B. Parts having the same reference numerals as those of FIGS. 9A and 9B indicate the same portions, and therefore an explanation of those parts is omitted.

FIG. 10A is a top view of an EL display device of this embodiment, and FIG. 10B shows a cross sectional diagram in which FIG. 10A is cut along the line A–A'.

In accordance with FIGS. 9A and 9B, manufacturing is performed through the step of forming the passivation film 6003 covering the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of $\mu$m of aluminum foil is sandwiched by a PVF film or a Mylar film.

However, depending upon the light emission direction from the EL device (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light curing resin as the sealing material 6002 at this point, but provided that the heat resistance characteristics of the EL layer permit, a thermal curing resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014 and 4015 are also electrically connected to the FPC 4017 by similarly passing underneath the sealing material 6002.

Note that the covering material 6000 is bonded, and the frame material 6001 is attached so as to cover the lateral surfaces (exposed surfaces) of the filling material 6004, after forming the filling material 6004 in FIGS. 10A and 10B, but the filling material 6004 may also be formed after attaching the covering material 6000 and the frame material 6001. In this case, a filling material injection opening is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

[Embodiment 4]

Figure 11:
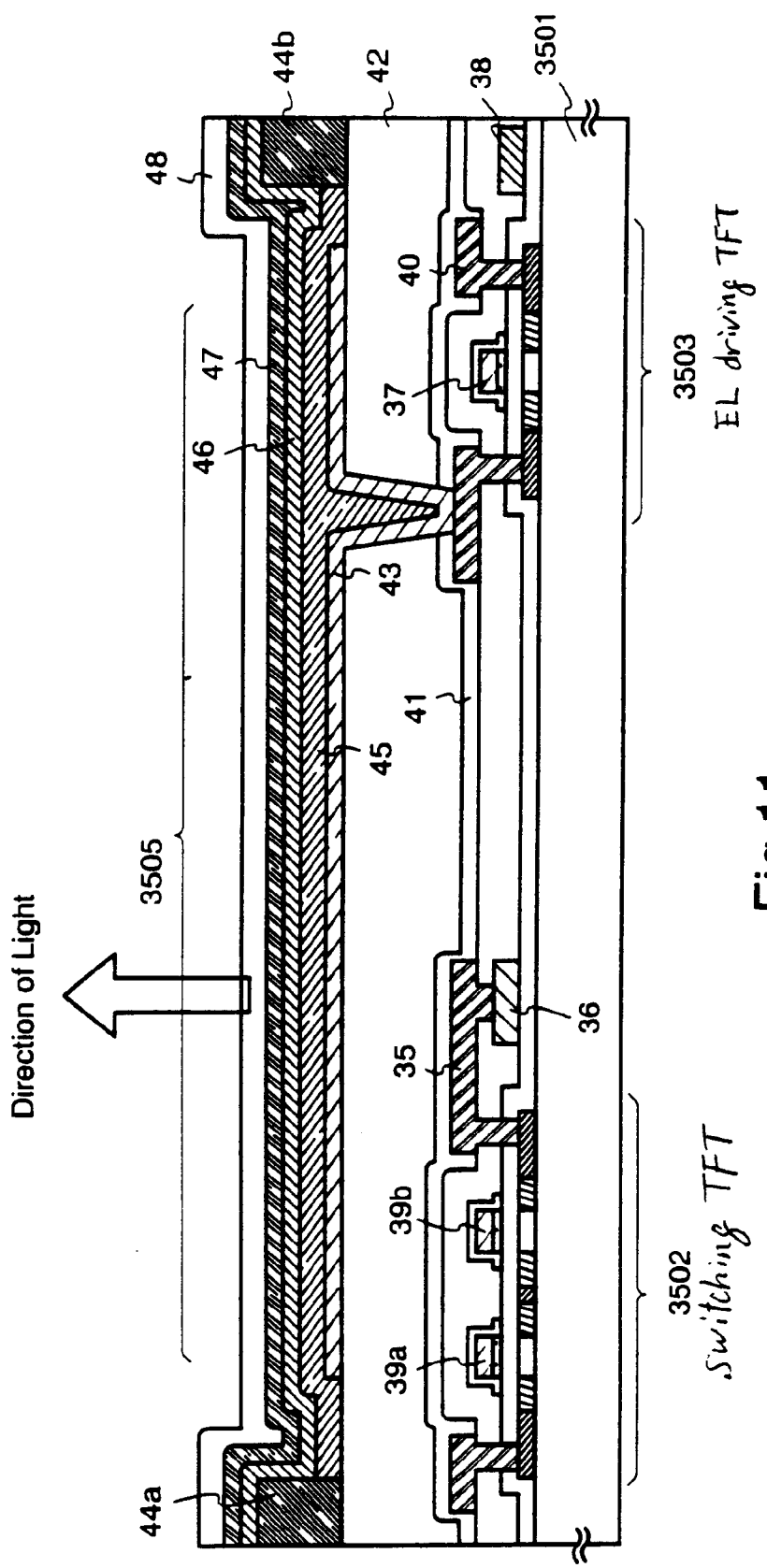
FIG. 11 is a schematic view of a sectional structure of an EL display of Embodiment 4.

A more detailed cross sectional structure of a pixel portion is shown here in FIG. 11. A switching TFT 3502 formed on a substrate 3501 is manufactured by using a known method. A double gate structure is used in this embodiment. Note that although a double gate structure is used in this embodiment, a single gate structure, a triple gate structure, and a multi gate structure possessing a greater number of gates may also be used.

Each of an EL driver TFT 3503 and the power source control TFT 3504 is an n-channel TFT, and is manufactured using a known method. A drain wiring 35 of the switching TFT 3502 is electrically connected to the gate electrode 37b of the EL driver TFT 3503 by a wiring 36. The source wiring 40b of the EL driver TFT 3503 is connected to a drain wiring 40a of the power source control TFT. Further, a wiring denoted by reference numeral 38 is a gate signal line for electrically connecting gate electrodes 39a and 39b of the switching TFT 3502. Furthermore, a drain wiring 34 of the EL driver TFT 3503 is connected to an power source supply line (not shown in the figures), and a constant voltage is always applied. The gate electrode 37a of the power control TFT 3504 is connected to an power source control line (not shown in the figures).

In this embodiment, the structure is that a source wiring of the power source control TFT is connected to a cathode of an EL element, a drain wiring is connected to a source wiring of the EL driver TFT, and the a drain wiring of the EL driver TFT is connected to a power source supply line. The structure can also be that a source wiring of the EL driver TFT is connected to a cathode of an EL element, a drain wiring is connected to a source wiring of the power source control TFT and a drain wiring of the power source control TFT is connected to the power source supply line. Therefore, it is possible to perform with combining the structure of Embodiment 2.

A single gate structure of the EL driver TFT 3503 and the current control TFT 3504 are shown in the figures in this embodiment, but a multi-gate structure in which a plurality of TFTs are connected in series may also be used. In addition, a structure in which a plurality of TFTs are connected in parallel, effectively partitioning into a plurality of channel forming regions, and which can perform radiation of heat with high efficiency, may also be used. This structure is effective to suppress the deterioration by the heat.

A first passivation film 41 is formed on the switching TFT 3502, the EL driver TFT 3503 and the power source control TFT 3504, and a leveling film 42 is formed on top of that from an insulating resin film. It is extremely important to level the step due to the TFTs using the leveling film 42. An EL layer formed later is extremely thin, so there are cases in which defective light emissions occur caused by the steps. Therefore, to form the EL layer with as level a surface as possible, it is preferable to perform leveling before forming a pixel electrode.

Furthermore, reference numeral 43 denotes a pixel electrode (EL element cathode) made from a conducting film with high reflectivity, and this is electrically connected to a drain region of the power source control TFT 3504. It is preferable to use a low resistance conducting film, such as an aluminum alloy film, a copper alloy film, and a silver alloy film, or a laminate of such films. Of course, a lamination structure with another conducting film may also be used.

In addition, a light emitting layer 45 is formed in a groove (corresponding to a pixel) formed by banks 44a and 44b, which are formed by insulating films (preferably resins). Note that only one pixel is shown in the figures here, but the light emitting layer may be formed and divided to correspond to each of the colors R (red), G (green), and B (blue). A π conjugate polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Shenk, H., Becker, H., Gelsen, O., Kluge, E., Kreuder, W., and Spreitzer, H., "Polymers for Light Emitting Diodes", Euro Display Proceedings, 1999, pp. 33–37, and in Japanese Patent Application Laid-open No. Hei 10-92576, for example, may be used.

As specific light emitting layers, cyano-polyphenylene vinylene may be used as a red light emitting layer, polyphenylene vinylene may be used as a green light emitting layer, and polyphenylene vinylene or polyalkylphenylene may be used as a blue light emitting layer. The film thicknesses may be between 30 and 150 nm (preferably between 40 and 100 nm).

However, the above example is one example of the organic EL materials which can be used as light emitting layers, and it is not necessary to limit use to these materials. An EL layer (a layer for emitting light and for performing carrier motion for such) may be formed by freely combining light emitting layers, electric charge transporting layers, and electric charge injecting layers.

For example, this embodiment shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials. A laminar structure EL layer, in which a hole injecting layer 46 made from PEDOT (polythiophene) or PAni (polyaniline) is formed on the light emitting layer 45, is used in this embodiment. An anode 47 is then formed on the hole injecting layer 46 from a transparent conducting film. The light generated by the light emitting layer 45 is radiated toward the upper surface (toward the top of the TFT) in this embodiment, and therefore the anode must be transparent to light. An indium oxide and tin oxide compound, or an indium oxide and zinc oxide compound can be used for the transparent conducting film. However, because it is formed after forming the low heat resistance light emitting and hole injecting layers, it is preferable to use a material which can be deposited at as low a temperature as possible.

An EL element 3505 is complete at the point where the anode 47 is formed. Note that what is called the EL element 3505 here is formed by the pixel electrode (cathode) 43, the light emitting layer 45, the hole injecting layer 46, and the anode 47. The pixel electrode 43 is nearly equal in area to the pixel, and consequently the entire pixel functions as an EL device. Therefore, the light emitting efficiency is extremely high, and a bright image display becomes possible.

In addition, a second passivation film 48 is then formed on the anode 47 in this embodiment. It is preferable to use a silicon nitride film or a silicon nitride oxide film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display of the present invention has a pixel portion made from pixels structured as in FIG. 11, and has a switching TFT with a sufficiently low off current value, and a EL driver TFT which is strong with respect to hot carrier injection. An EL display having high reliability, and in which good image display is possible, can therefore be obtained.

Note that it is possible to implement the constitution of this embodiment by freely combining it with the constitutions of any of embodiments 1 to 3.

[Embodiment 5]

Figure 12:
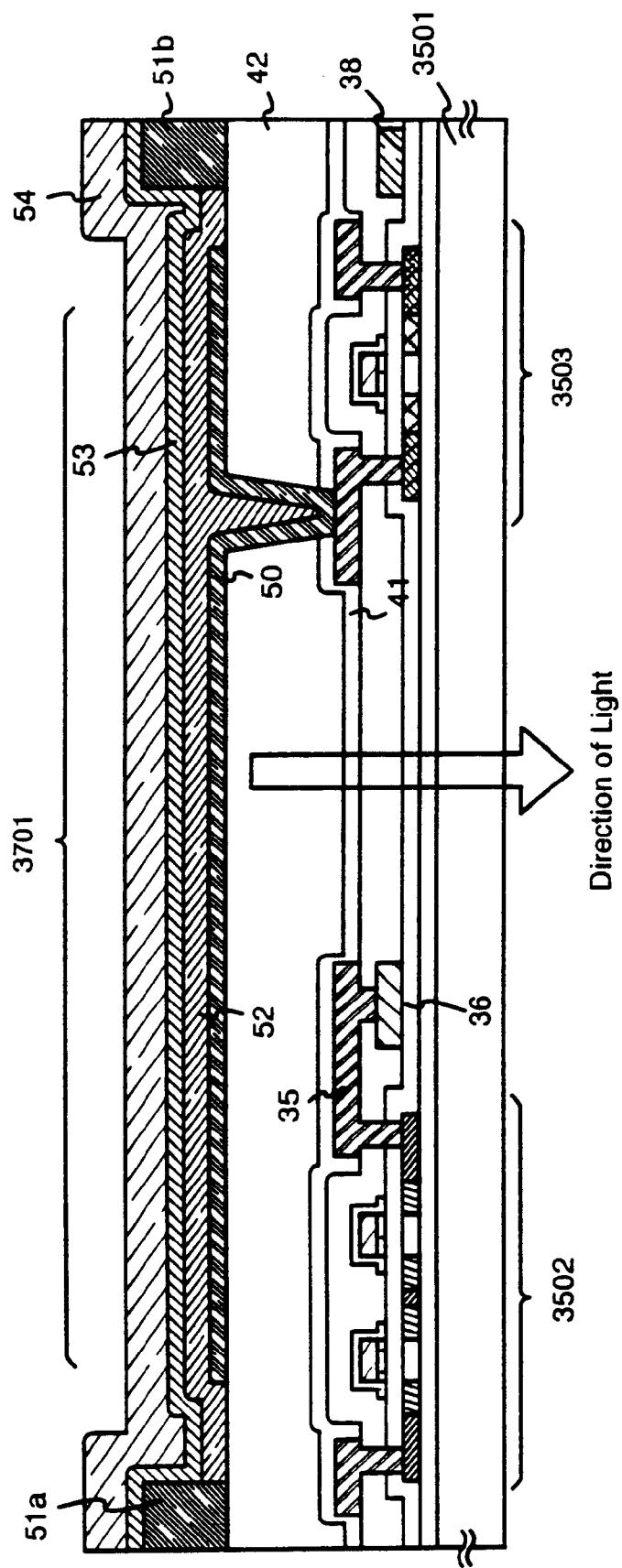
FIG. 12 is a schematic view of a sectional structure of an EL display of Embodiment 5.

In this embodiment, a description will be made on a structure where in the pixel portion shown in the embodiment 4, the structure of the EL element 3505 is inverted. FIG. 12 is used for the description. Note that since different points from the structure of FIG. 11 (Embodiment 4) are only an EL element part, an EL driving TFT and a power source controlling TFT, the description of other portions is omitted.

In FIG. 12, an EL driving TFT 3503 and a power source controlling TFT 3504 are p-channel TFTs, and can be formed by a well-known method. Note that in this embodiment, although such a structure is adopted that a source wiring line of the power source controlling TFT is connected to an anode of an EL element, a drain wiring line is connected to a source wiring line of the EL driving TFT, and a drain wiring line of the EL driving TFT is connected to a power source supply line, such a structure may be adopted that the source wiring line of the EL driving TFT is connected to the anode of the EL element, the drain wiring line is connected to the source wiring line of the power source controlling TFT, and the drain wiring line of the power source controlling TFT is connected to the power source supply line. That is, this embodiment can be combined with the structure of the embodiment 2 to carry out the present invention.

In this embodiment, a transparent conductive film is used as a pixel electrode (anode) 50. Specifically, a conductive film made of a compound of indium oxide and zinc oxide is used. Of course, a conductive film made of a compound of indium oxide and tin oxide may be used.

After then forming banks 51a and 51b from insulating films, a light emitting layer 52 is formed from polyvinyl carbazole by solution coating. An electron injecting layer 53 is formed on the light emitting layer from potassium acetylacetonate (denoted acacK), and a cathode 54 is formed from an aluminum alloy. In this case the cathode 54 also functions as a passivation film. An EL element 3701 is thus formed.

The light generated by the light emitting layer 52 is radiated toward the substrate on which the TFT is formed in embodiment 5, as shown by the arrows.

Note that it is possible to implement the constitution of embodiment 5 by freely combining it with the constitution of any one of embodiments 1 to 3.

[Embodiment 6]

Figure 24A:
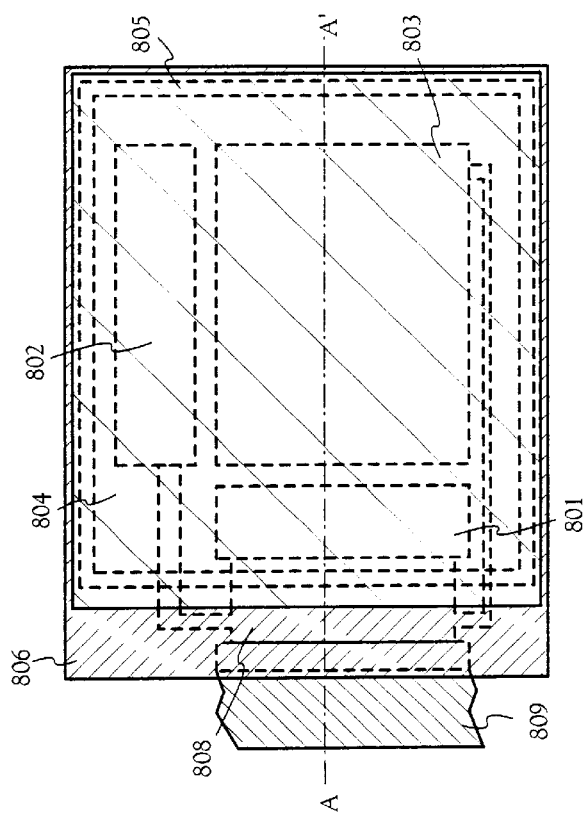
FIGS. 24A and 24B are a top view and a sectional view of an EL display of Embodiment 6.

In this embodiment, an example in which an EL display is fabricated using the present invention will be described with reference to FIGS. 24A and 24B. FIG. 24A is a top view showing a state where sealing of an EL element has been carried out in an active matrix substrate on which the EL element is formed. Reference numeral 801, a portion indicated by a dotted line, designates a source side driver circuit; 802, a gate side driver circuit; and 803, a pixel portion. Besides, reference numeral 804 designates a cover member; 805, a first seal member; and 806, a second seal member. A filler 807 (see FIG. 24B) is provided between the cover member of the inside surrounded by the first seal member 805 and the active matrix substrate.

Reference numeral 808 designates a connection wiring line for transmitting signals inputted to the source side driver circuit 801, the gate side driver circuit 802, and the pixel portion 803, and receives a video signal and a clock signal from an FPC (Flexible Printed Circuit) 809 which becomes a connection terminal to an external instrument.

Figure 24B:
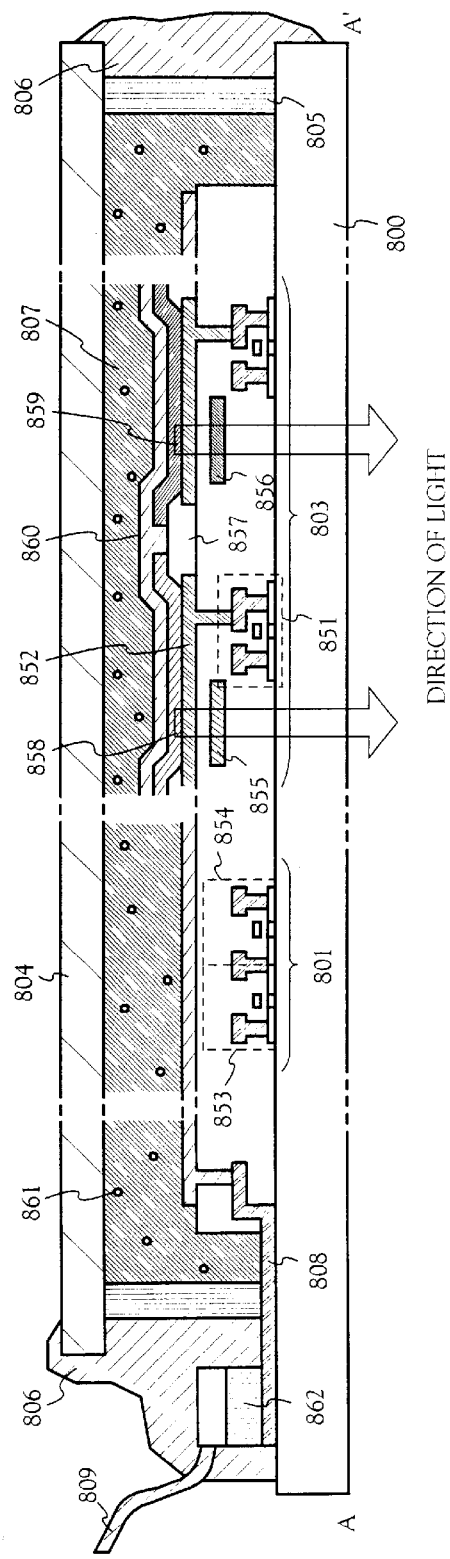

Here, FIG. 24B is a sectional view corresponding to a section taken along line A–A' of FIG. 24A. The same portions in FIGS. 24A and 24B are designated by the same symbols.

As shown in FIG. 24B, the pixel portion 803 and the source side driver circuit 801 are formed on a substrate 800. The pixel portion 803 is formed of a plurality of pixels each including a TFT (not shown) (hereinafter referred to as an EL driving TFT) for controlling a current flowing to an EL element, a TFT (hereinafter referred to as a power source controlling TFT) 851 for controlling an EL driver voltage, a pixel electrode 852 electrically connected to a drain region thereof, and the like. In this embodiment, the power source controlling TFT 851 is a p-channel TFT. The source side driver circuit 801 is formed by using a CMOS circuit in which an n-channel TFT 853 and a p-channel TFT 854 are complementarily combined.

In this embodiment, although such a structure is adopted that a drain wiring line of the power source controlling TFT is connected to a pixel electrode of the EL element, and a source wiring line thereof is connected to a drain wiring line of the EL driving TFT, such a structure may be adopted that the drain wiring line of the EL driving TFT is connected to the pixel electrode of the EL element, and the source wiring line thereof is connected to the drain wiring line of the power source controlling TFT. This is equivalent to the case where the structure of the embodiment 1 is combined.

Each pixel includes, under the pixel electrode, a color filter (R) 855, a color filter (G) 856, and a color filter (B) (not shown). Here, the color filter (R) is a filter for extracting red light, the color filter (G) is a color filter for extracting green light, and the color filter (B) is a color filter for extracting blue light. Note that the color filter (R) 855 is provided for a pixel of red light emission, the color filter (G) 856 is provided for a pixel of green light emission, and the color filter (B) is provided for a pixel of blue light emission.

As effects of the case where these color filters are provided, first, it is possible to point out the improvement of color purity of light emission color. For example, in the pixel of red light emission, red light is radiated from the EL element (in this embodiment, it is radiated to the side of the pixel electrode), and when this red light is made to pass through the color filter for extracting red light, the purity of red can be improved. This is the same with the cases of green light and blue light.

In a conventional structure where a color filter is not used, there can occur a problem that visible light intruding from the outside of an EL display device excites a light emitting layer of an EL element so that a desired color can not be obtained. However, by providing the color filters as in this embodiment, only specified wavelength light enters the EL element. That is, it is possible to prevent such a disadvantage that the EL element is excited by light from the outside.

Although a structure of providing a color filter is conventionally proposed, an EL element of white light emission has been used. In this case, light of other wavelengths has been cut to extract red light, so that the brightness has been lowered. However, in this embodiment, for example, red light radiated from the EL element is made to pass through the color filter for extracting red light, so that lowering of the brightness is not caused.

Next, the pixel electrode 852 is formed of a transparent conductive film, which functions as an anode of the EL element. An insulating film 857 is formed at both ends of the pixel electrode 852, and further, a light emitting layer 858 for emitting red light and a light emitting layer 859 for emitting green light are formed. Although not shown, a light emitting layer for emitting blue light is provided in an adjacent pixel, and a color display is made by the pixels corresponding to red, green and blue. Of course, a color filter for extracting blue is provided for the pixel in which the light emitting layer of blue light is provided.

As the EL material, not only an organic material but also an inorganic material can be used. Besides, a laminate structure including an electron injection layer, an electron transport layer, a hole transport layer or a hole injection layer, in addition to the light emitting layer, may be adopted.

Over the respective light emitting layers, a cathode 860 of the EL element is formed of a conductive film having a light shielding property. This cathode 860 is common to all pixels and is electrically connected to the FPC 809 through the connection wiring line 808.

Next, the first seal member 805 is formed by a dispenser or the like, and spacers (not shown) are scattered to bond the cover member 804. Then the filler 807 is filled in a region surrounded by the active matrix substrate, the cover member 804, and the first seal member 805 by a vacuum injection method.

In this embodiment, barium oxide as a hygroscopic material 861 is previously added to the filler 807. Although the hygroscopic material is added to the filler and is used in this embodiment, it is also possible to seal the hygroscopic material in the filler by dispersing it into clusters. Although not shown, it is also possible to use a hygroscopic material as a material of the spacer.

Next, after the filler 807 is hardened by ultraviolet ray irradiation or heating, an opening portion (not shown) formed in the first seal member 805 is closed. When the opening portion of the first seal member 805 is closed, the connection wiring line 808 and the FPC 809 are electrically connected to each other by using a conductive material 862. Further, a second seal member 806 is provided to cover an exposed portion of the first seal member 805 and a part of the FPC 809. The second seal member 806 may be made of the same material as the first seal member 805.

By sealing the EL element in the filler 807 using the method as described above, the EL element can be completely shut off from the outside, and it is possible to prevent a material which promotes oxidation of an organic material, such as moisture or oxygen the outside of the outside, from entering. Thus, it is possible to fabricate an EL display device with high reliability.

Note that the structure of this embodiment can be freely combined with any structure of the embodiments 1 to 3.

[Embodiment 7]

Figure 25:
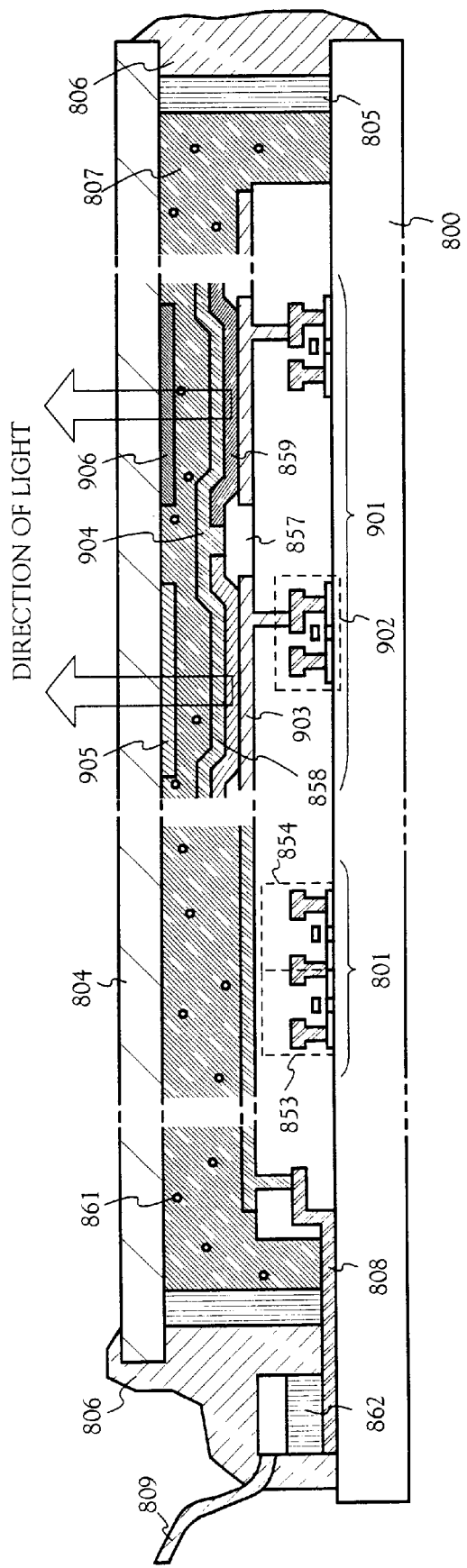
FIG. 25 is a sectional view of an EL display of Embodiment 7.

In this embodiment, a description will be made on an example of a case where in the EL display device shown in the embodiment 6, the radiation direction of light emitted from the EL element and the arrangement of the color filters are changed. Although FIG. 25 is used for the description, since the basic structure is the same as that of FIG. 24B, new symbols are attached to modified portions and the description will be made.

In this embodiment, n-channel TFTs are used as a power source controlling TFT 902 and an EL driving TFT (not shown) in a pixel portion 901. Besides, a pixel electrode 903 is electrically connected to a drain of the power source controlling TFT 902, and this pixel electrode 903 is formed of a conductive film having a light shielding property. In this embodiment, the pixel electrode 903 becomes a cathode of the EL element.

A transparent conductive film 904 common to each pixel is formed on a light emitting layer 858 for emitting red light and a light emitting layer 859 for emitting green light. This transparent conductive film 904 becomes an anode of the EL element.

This embodiment is characterized in that a color filter (R) 905, a color filter (G) 906, and a color filter (B) (not shown) are formed at the cover member 804. In the case where the structure of the EL element of this embodiment is adopted, since the radiation direction of light emitted from the light emitting layer is directed to the side of the cover member, if the structure of FIG. 25 is adopted, the color filter can be disposed in the passage of the light.

When the color filter (R) 905, the color filter (G) 906, and the color filter (B) (not shown) are formed at the cover member 804, steps of an active matrix substrate can be decreased, and there are advantages that a yield and throughput can be improved.

Note that the structure of this embodiment can be freely combined with any structure of the embodiments 1 to 3.

[Embodiment 8]

The material used in the EL layer of the EL element in the EL display of the present invention is not limited to an organic EL material, and the present invention can be implemented using an inorganic EL material. However, at present inorganic EL materials have an extremely high driver voltage, and therefore TFTs which have voltage resistance characteristics such that they are able to withstand such a high voltage must be used.

Alternately, if an inorganic EL material having a lower driver voltage is developed in the future, it is possible to apply such a material to the present invention.

Furthermore, it is possible to freely combine the constitution of this embodiment with the constitution of any of Embodiments 1 to 7.

[Embodiment 9]

In the present invention, an organic material used as an EL layer may be either a low molecular organic material or a polymer (high molecular) organic material. As the low molecular organic material, materials are known centering on $Alq_3$ (tris-8-quinolylite-aluminum), TPD (triphenylamine derivative) or the like. As polymer organic material, π-cooperative polymer materials can be given. Typically, PPV (polyphenylenevynilene), PVK(polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a hole transport layer, the electron transport layer and the hole transport layer may be formed of inorganic material such as, for example, a non-crystalline semiconductor formed of non-crystal Si or non-crystalline $Si_{1-x}C_x$ or the like.

In the non-crystalline semiconductor, a large quantity of trap level is present, and at the same time, the non-crystalline semiconductor forms a large quantity of interface levels at an interface at which the non-crystalline semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, lubren, coumarin 6, TPB and quinaquelidon.

[Embodiment 10]

In this embodiment, a description is shown in FIGS. 13A to FIG. 16C given of a method of simultaneously manufacturing switching TFTs of a pixel portion, an EL driving TFT and driving circuit portion TFTs formed in the periphery portion of the power source control TFT and the pixel portion. Concerning the driver circuit, the CMOS circuit is shown in the figure, for a brief description.

First, a substrate 501 in which a base film (not shown) is disposed on the surface thereof is prepared as shown in FIG. 13A. In this embodiment, a silicon nitride oxide film whose thickness is 100 nm and another silicon nitride oxide film whose thickness is 200 nm are laminated and are used as a base film on a crystallization glass. At this time, preferably, the concentration of nitrogen of the film contacting the crystallized glass substrate is kept to 10–25 wt %. It is possible to form an element directly on a quartz substrate without any base film.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

The steps from here to FIG. 13C can be understood from cite Japanese Laid-open Patent No. 10-247735 filed by the present applicant. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 (Ni containing layer) that contains nickel (Ni) is formed on the protective film 504 by a spin coat method. Concerning the formation of the Ni containing layer, reference can be made to the above publication.

Thereafter, as shown in FIG. 13B, heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines.

Thereafter, as shown in FIG. 13C, an element (phosphorus preferably) that belongs to Group 15 is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 13C. Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2 \times 10^{17}$ atoms/cm$^3$ according to the measurement value by SIMS (mass secondary ion analysis). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2 \times 10^{17}$ atoms/cm$^3$) in practice.

The polysilicon film 509 can be thus obtained that is crystallized by a catalyst and is decreased to the level in which the catalyst does not obstruct the operation of a TFT. Thereafter, active layers 510–513 that use the polysilicon film 509 only are formed by a patterning process. At this time, a marker to conduct mask alignment in the following patterning should be formed by using the above polysilicon film. (FIG. 13D)

Thereafter, a silicon nitride oxide film 50 nm thick is formed by the plasma CVD method as shown in FIG. 13E, heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510–513 is made 30 nm by the thermal oxidation process.

Figure 14A:
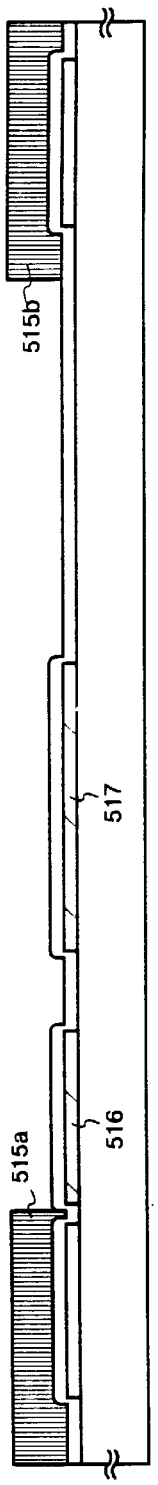
FIGS. 14A to 14D are views showing the fabricating process of the EL display of Embodiment 10.

Thereafter, as shown in FIG. 14A, resist masks 515a and 515b are formed, and an impurity element (hereinafter, designated as p-type impurity element) that gives the p-type through the gate insulating film 514 is added. As the p-type impurity element, an element that belongs to Group 13 elements representatively, boron or gallium typically, can be used. This step (called a channel doping step) is a process for controlling the threshold voltage of a TFT.

In this embodiment, boron is added by the ion doping method in which plasma excitation is performed without the mass separation of diborane ($B_2H_6$). The ion implantation method that performs the mass separation can be used, of course. According to this process, impurity regions 516 and 517 are formed that includes boron at the concentration of $1 \times 10^{15}$-$1 \times 10^{18}$ atoms/cm$^3$ ($5 \times 10^{16}$-$5 \times 10^{17}$ atoms/cm$^3$ representatively).

Figure 14B:
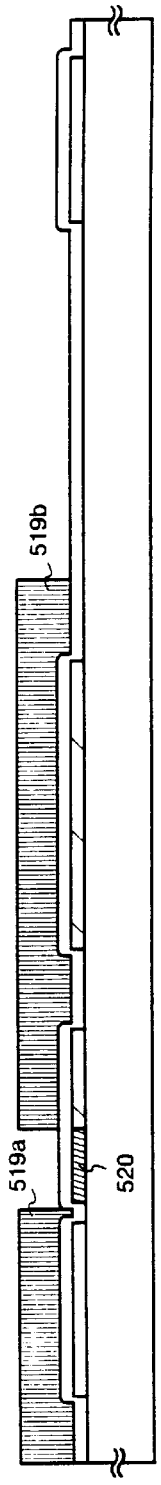

Thereafter, resist masks 519a and 519b are formed as shown in FIG. 14B, and an impurity element (hereinafter, designated as n-type impurity element) that gives the n-type through the gate insulating film 514 is added. As the n-type impurity element, an element that belongs to Group 15 elements representatively, phosphorus or arsenic typically can be used. In this embodiment, a plasma doping method in which plasma excitation is performed without the mass separation of phosphine ($PH_3$) is used. Phosphorus is added in the concentration of $1 \times 10^{18}$ atoms/cm$^3$. The ion implantation method that performs mass separation can be used, of course.

A dose amount is adjusted so that the n-type impurity element is included in the n-type impurity regions 520 formed by this process at the concentration of $2 \times 10^{16}$-$5 \times 10^{19}$ atoms/cm$^3$ ($5 \times 10^{17}$-$5 \times 10^{18}$ atoms/cm$^3$ representatively).

Figure 14C:
Figure 14D:
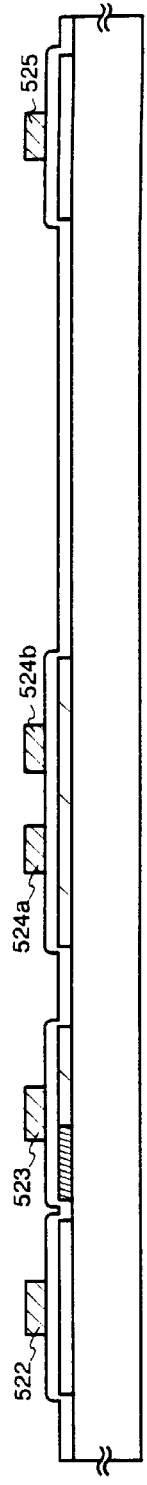

Thereafter, a process is performed for activating the added n-type impurity element and the added p-type impurity element as shown in FIG. 14C. There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 14A.

Since the crystallization glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity regions 520 namely, the boundary (junction) between the n-type impurity regions 520 and the region (p-type impurity region formed by the process of FIG. 14A) around the n-type impurity regions 520 where the n-type impurity element is not added. This means that the LDD region and the channel formation region can form an excellent junction when a TFT is later completed.

Thereafter, a conductive film 200–400 nm thick is formed, and patterning is performed, so that gate electrodes 522–525 are formed. The length of each TFT channel is decided by the line width of those gate electrodes 522–525.

The gate electrode can be made of a conductive film of a single-layer, however, preferably, a lamination film, such as two-layer or three-layer film is used when necessary. A known conductive film can be used as the material of the gate electrode. Specifically, the film which can be used are films made of an element selected from the group consisting of tantalum (Ta), titanium (Ti), molybdenum (Mo), tungsten (W), chrome (Cr), and silicon (Si) having conductivity; a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a sputtering gas, the film can be prevented from peeling off because of stress.

At this time, the gate electrodes 523 are formed to overlap with a part of the n-type impurity regions 520 respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other. Further the gate electrode 522 and 523 are seen as separate, in fact, they are connected electrically to each other.

Figure 15A:
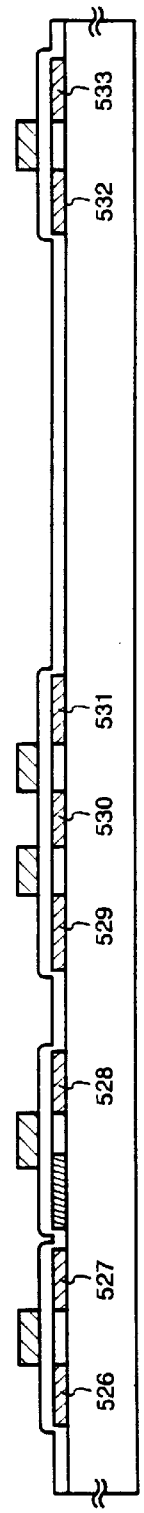
FIGS. 15A to 15D are views showing the fabricating process of the EL display of Embodiment 10.

Thereafter, with the gate electrodes 522–525 as masks, an n-type impurity element (phosphorus in this embodiment) is added in a self-alignment manner, as shown in FIG. 15A. At this time, an adjustment is performed so that phosphorus is added to the thus formed impurity regions 526–533 at the concentration of 1/2-1/10 (1/3-1/4 representatively) of that of the n-type impurity regions 520. Practically, the concentration is $1 \times 10^{16}$-$5 \times 10^{18}$ atoms/cm$^3$ ($3 \times 10^{17}$-$3 \times 10^{18}$ atoms/cm$^3$ typically).

Figure 15B:
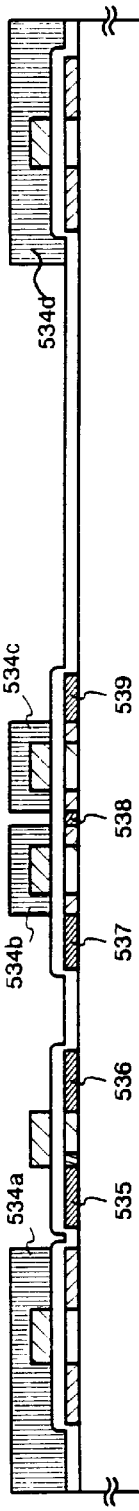

Thereafter, as shown in FIG. 15B, resist masks 534a–534d are formed to cover the gate electrode, an n-type impurity element (phosphorus in this embodiment) is then added, and impurity regions 535–539 including a high concentration of phosphorus are formed. The ion doping method using phosphine ($PH_3$) is applied also herein, and an adjustment is performed so that the concentration of phosphorus in these regions is $1 \times 10^{20}$-$1 \times 10^{21}$ atoms/cm$^3$ ($2 \times 10^{20}$-$5 \times 10^{20}$ atoms/cm$^3$ representatively).

A source region or a drain region of the n-channel type TFT is formed through this process, and the switching TFT leaves a part of the n-type impurity regions 528–531 formed in the process of FIG. 15A. The leaving part comes to an LDD region of the switching TFT.

Figure 15C:
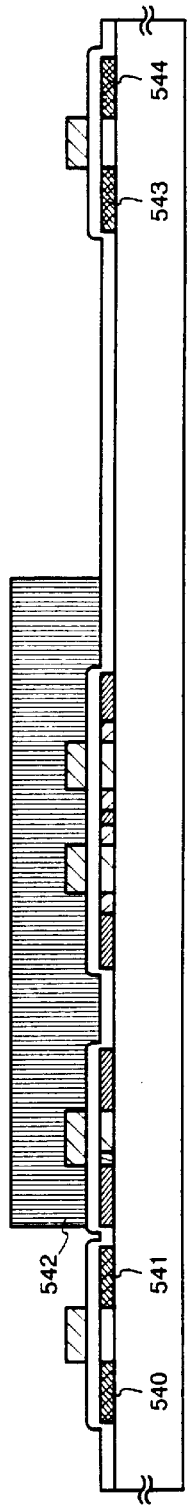

Thereafter, as shown in FIG. 15C, the resist masks 534a–534d are removed, and a resist mask 542 is newly formed. A p-type impurity element (boron in this embodiment) is then added, and impurity regions 540, 541, 543a, 543b, 544a and 544b including a high concentration of boron are formed. Herein, according to the ion dope method using diborane ($B_2H_6$), boron is added to obtain a concentration of $3 \times 10^{20}$-$3 \times 10^{21}$ atoms/cm$^3$ ($5 \times 10^{20}$-$1 \times 10^{21}$ atoms/cm$^3$ representatively).

Phosphorus has been already added to the impurity regions 540, 541, 543a, 543b, 544a and 544b at a concentration of $1 \times 10^{20}$-$1 \times 10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Figure 15D:
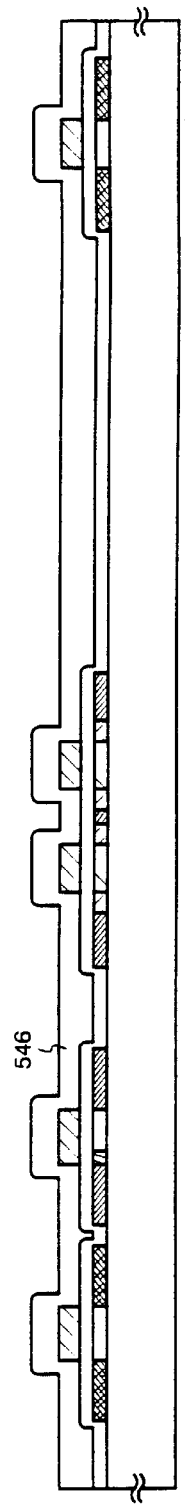

Thereafter, as shown in FIG. 15D, the resist mask 542 is removed, and then a first interlayer insulating film 546 is formed. As the first interlayer insulating film 546, an insulating film that includes silicon is used in the form of a single-layer structure or a stacked-layer structure as a combination thereof. Preferably, the film thickness thereof is 400 nm–1.5 µm. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate unpaired bonds of a semiconductor film by thernally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Thereafter, as shown in FIG. 16A, contact holes are made in the first interlayer insulating film 546, and source lines 547–550 and drain wiring lines 551–553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50–500 nm thick (200–300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this preprocess is supplied to the first interlayer insulating film 546, and, through heat treatment, the film quality of the first passivation film 554 is improved. At the same time, since hydrogen that is added to the first interlayer insulating film 546 diffuses onto the lower side, the active layer can be effectively hydrogenated.

Thereafter, as shown in FIG. 16B, a second interlayer insulating film 555 made of organic resin is formed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 µm thick in this embodiment.

Thereafter, contact holes that reach the drain wiring line 553 are made in the second interlayer insulating film 555 and the first passivation film 554, and then a pixel electrode (anode) 556 is formed. In this embodiment, the indium tin oxide film (ITO) is formed as a pixel electrode by forming to be 110 nm thick and patterned. A transparent conductive film can be used in which zinc oxide (ZnO) of 2–20% is mixed with indium tin oxide film also can be used. This pixel electrode is an anode of an EL element 203.

Thereafter, an insulating film (a silicon oxide film in this embodiment) that includes silicon is formed to be 500 nm thick, an opening is then formed at the position corresponding to the pixel electrode 556, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Next, the EL layer 558 and the cathode (MgAg electrode) 559 are formed using the vacuum deposition method without air release. The thickness of the EL layer is 80–200 nm (100–120 nm typically); the cathode 559 thereof is 180–300 nm (200–250 nm typically).

In this process, an EL layer and cathode are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to mask pixels except a desired one by the use of the metal mask, and selectively form an EL layer for the desired pixel.

In detail, a mask is first set for concealing all pixels except a pixel corresponding to red, and an EL layer and a cathode of red light emission are selectively formed by the mask. Thereafter, another mask is set for concealing all pixels except a pixel corresponding to green, and an EL layer and a cathode of green light emission are selectively formed by the mask. Thereafter, as above, another mask is set for concealing all pixels except a pixel corresponding to blue, and an EL layer and a cathode of blue light emission are selectively formed by the mask. In this case, the different masks are used for the respective colors. Instead, the same mask may be used for them. Preferably, processing is performed without breaking the vacuum until the EL layer and a cathode are formed for all the pixels.

A known material can be used for the EL layer 558. Preferably, that is an organic material in consideration of driving voltage. For example, the EL layer can be formed with a four-layer structure consisting of a hole injection layer, a hole transporting layer, a luminescent layer, and an electronic injection layer. In this embodiment, an example of using MgAg electrode as a cathode of an EL element 203, although other well-known material also can be used.

As a protective electrode 560, the conductive layer, which contains aluminum as a main component, can be used. The protective electrode 560 is formed using a vacuum deposition method with another mask when forming the EL layer and the cathode. Further, the protective electrode is formed continually without air release after forming the EL layer and the cathode.

Lastly, a second passivation film 561 made of a silicon nitride film is formed to be 300 nm thick. Practically, a protective electrode 560 fills the role of protecting the protect EL layer from water. Furthermore, the reliability of an EL element 203 can be improved by forming the second passivation film 561.

An active matrix type EL display device constructed as shown in FIG. 16C is completed. The device is composed of a switching TFT 201, an EL driving TFT 202, a power source control TFT 203, a driving circuit n-channel type 204 and a driving circuit p-channel type TFT 205.

In practice, preferably, the device is packaged (sealed) by a highly airtight protective film (laminate film, ultraviolet cured resin film, etc.) or a housing material such as a ceramic sealing, in order not to be exposed to the air after completing the structure as shown in FIG. 16C.

[Embodiment 11]

Figure 21:
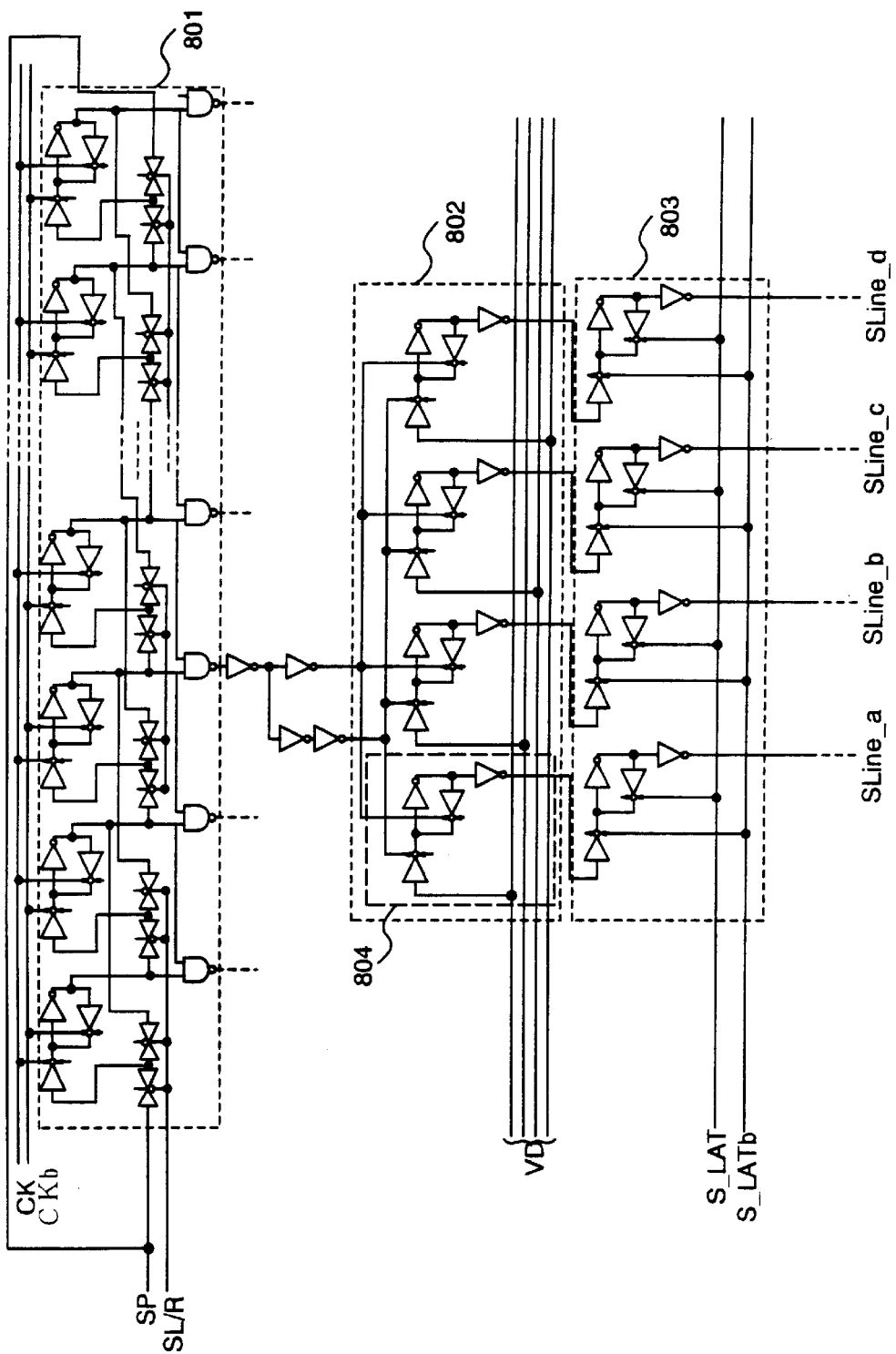
FIG. 21 is a circuit diagram of a source signal side driver circuit used in Embodiment 11.

A detailed structure of the source signal side driver circuit 102 shown by FIG. 1 is explained in this embodiment. A circuit diagram of an example of a source signal side driver circuit used in this embodiment is shown in FIG. 21.

Shift registers 801, latches (A) 802, and latches (B) 803 are arranged as shown in figures. Note that one group of the latches (A) 802 and the latches (B) 803 corresponds to four source signal lines SLine_1 to SLine_4 in embodiment 1. Further, a level shifter for changing the width of the amplitude of the signal voltage is not formed in this embodiment, but it may also be suitably formed by a designer.

A clock signal CK, a clock signal CKb in which the polarity of CK is inverted, a start pulse SP, and a driver direction changeover signal SL/R are each input to the shift registers 801 by wirings shown in figures. Further, a digital data signal VD input from the outside is input to the latches (A) 802 by wirings shown in figures. A latch signal S_LAT and a signal S_LATb, in which the polarity of S_LAT is inverted, are input to the latches (B) 803 by wirings shown in figures.

Regarding a detailed structure of the latches (A) 802, an example of a portion 804 of the latches (A) 802 which store the digital data signal corresponding to the source signal line SLine_a is explained. The portion 804 of the latches (A) 802 has two clocked invertors and two invertors.

Figure 22:
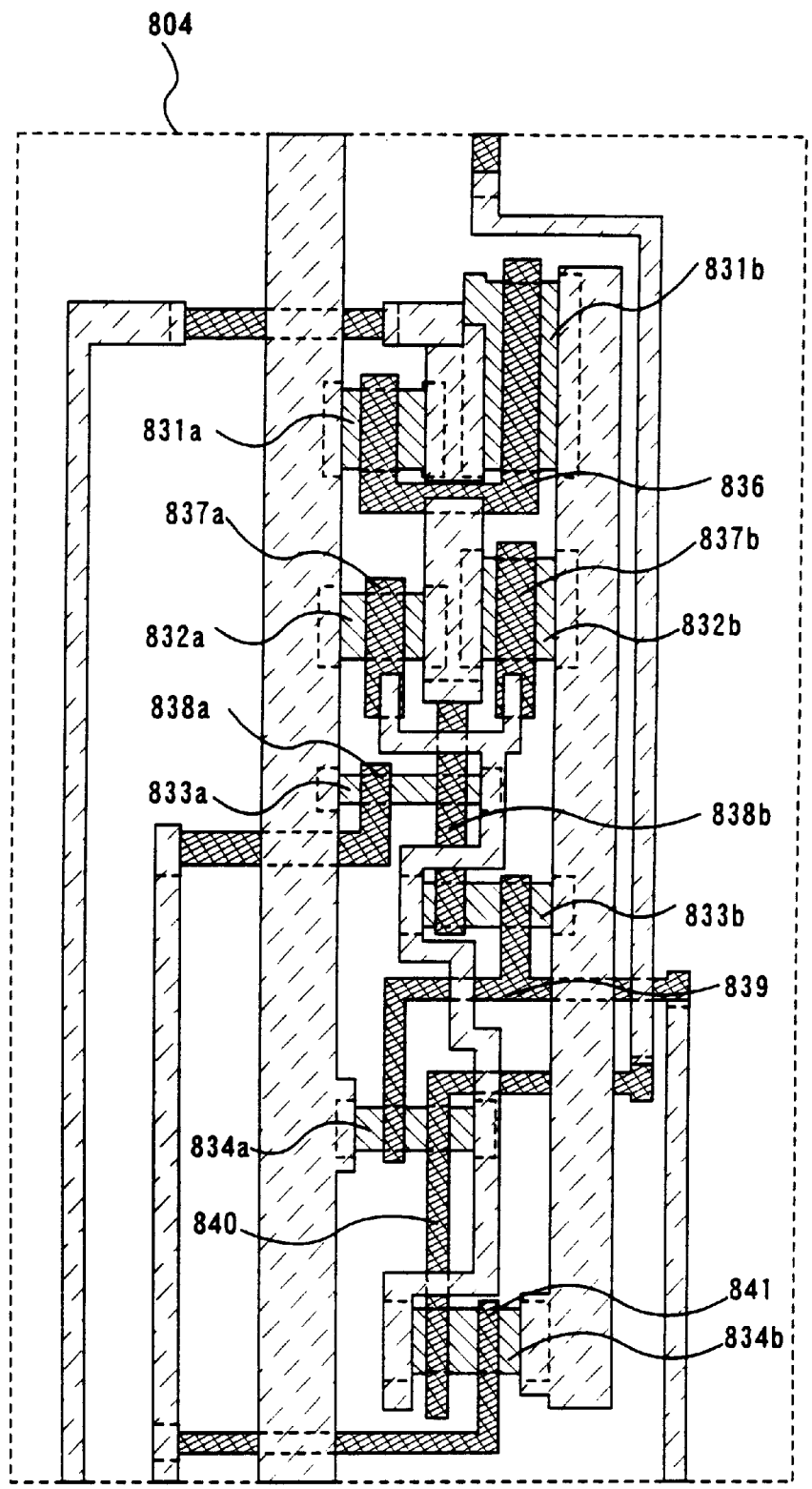
FIG. 22 is a top view of a latch circuit used in Embodiment 11.
Figure 23:
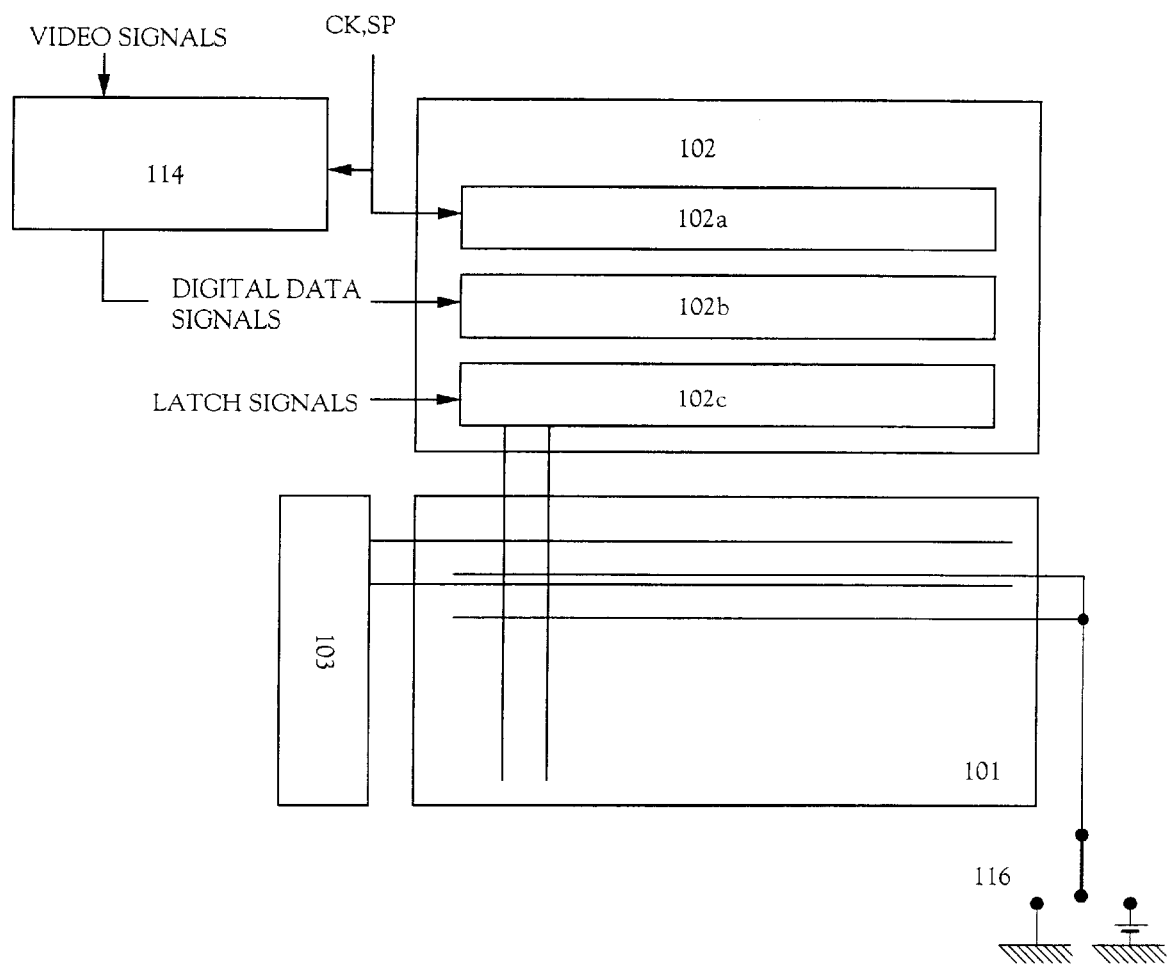
FIG. 23 is a view showing a circuit structure of a conventional EL display.

A top view of the portion 804 of the latches (A) 802 is shown in FIG. 22. Reference numerals 831a and 831b each denotes an active layer of a TFT forming one inverter of the portion 804 of the latches (A) 802, and reference numeral 836 denotes a common gate electrode of the TFT forming one inverter. Further, reference numerals 832a and 832b each denotes an active layer of another TFT forming one inverter of the portion 804 of the latches (A) 802, and references numerals 837a and 837b denote gate electrodes formed on the active layers 832a and 832b, respectively. Note that the gate electrodes 837a and 837b are electrically connected.

Reference numerals 833a and 833b each denotes an active layer of a TFT forming one clocked inverter of the portion 804 of the latches (A) 802. Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denotes an active layer of a TFT forming another clocked inverter of the portion 804 of the latches (A) 802. Gate electrodes 839 and 840 are formed on the active layer 834a, becoming a double gate structure. Further, gate electrodes 840 and 841 are formed on the active layer 834b, becoming a double gate structure.

[Embodiment 12]

The EL display device (EL module) formed by performing the present invention is superior to a liquid crystal display device in visibility in bright places because of its self-light emission properties. Therefore, the present invention can be used as a display portion of a direct-view type EL display (indicating a display equipped with an EL module). As the EL display, there are a personal computer monitor, a TV receiving monitor, an advertisement display monitor, and so on.

The present invention can be operated to all electronic apparatuses that include displays as constituent parts, including the aforementioned EL display.

As the electronic apparatuses, there are an EL display, video camera, digital camera, head mounted type display, car-navigator, personal computer, portable information terminal (mobile computer, mobile phone, electronic book, etc.), and picture reproducer provided with recording media (specifically, device which can reproduce a recording medium and equip a display capable of displaying the image such as compact disk (CD), laser disc (LD), or digital video disc (DVD)). Examples of the electronic apparatuses are shown in FIGS. 17A to 17E.

Figure 17A:
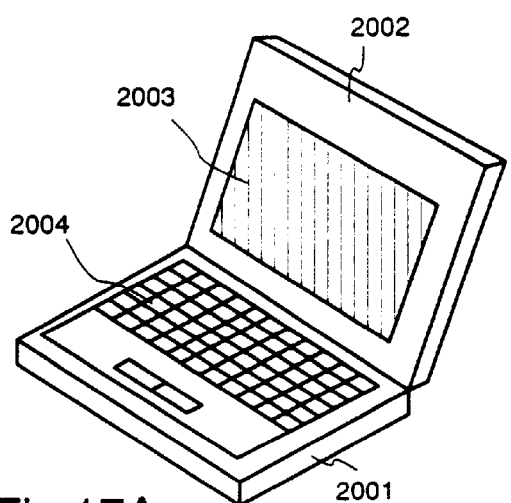
FIGS. 17A to 17E are views showing electronic apparatuses respectively using an EL display of Embodiment 12.

FIG. 17A depicts a personal computer, which includes a main body 2001, case 2002, display portion 2003, and keyboard 2004. The EL display of the present invention can be used as the display portion.

Figure 17B:
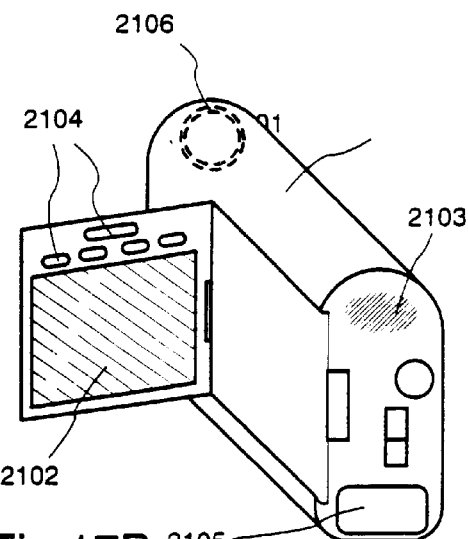

FIG. 17B depicts a video camera, which includes a main body 2101, display device 2102, voice inputting portion 2103, operation switch 2104, battery 2105, and image reception portion 2106. The EL display of the present invention can be used as the display portion.

Figure 17C:
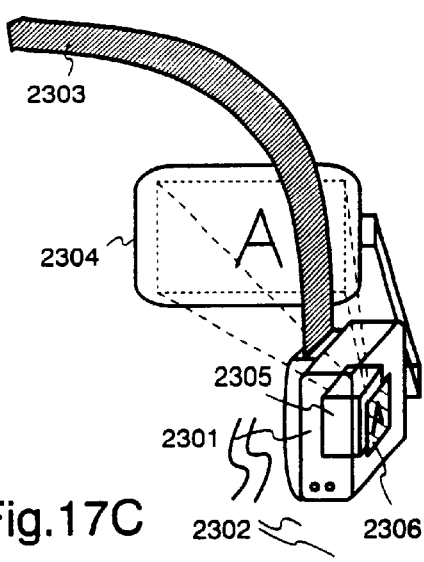

FIG. 17C depicts a part of a head mounted type EL display (right side), which includes a main body 2301, signal cable 2302, head fixation band 2303, display monitor 2304, optical system 2305, and display device 2306. The EL display pf the present invention can be used as the display portion.

Figure 17D:
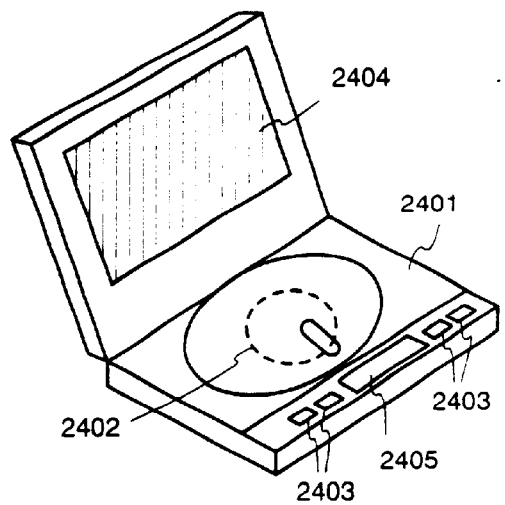

FIG. 17D depicts a picture reproducer (specifically, DVD reproducing player) provided with recording media, which includes a main body 2401, recording medium 2402 (CD, LD, DVD, etc.), operation switch 2403, display portion (a) 2404, and display portion (b) 2405. The display portion (a) chiefly displays image information, and the display portion (b) chiefly displays character information. The EL display of the present invention can be used as the display portions (a) and (b) of a picture reproducer provided with recording media. The present invention is applicable to a CD player or a game machine as a picture reproducer provided with recording media.

Figure 17E:
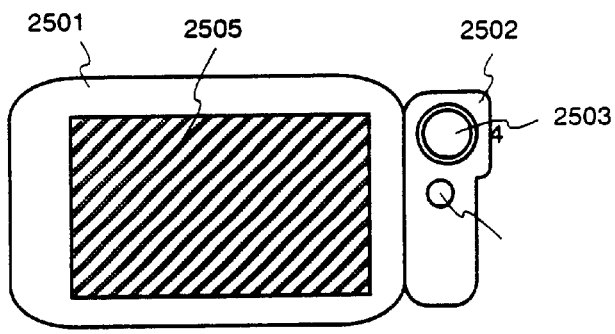
Figure 18:
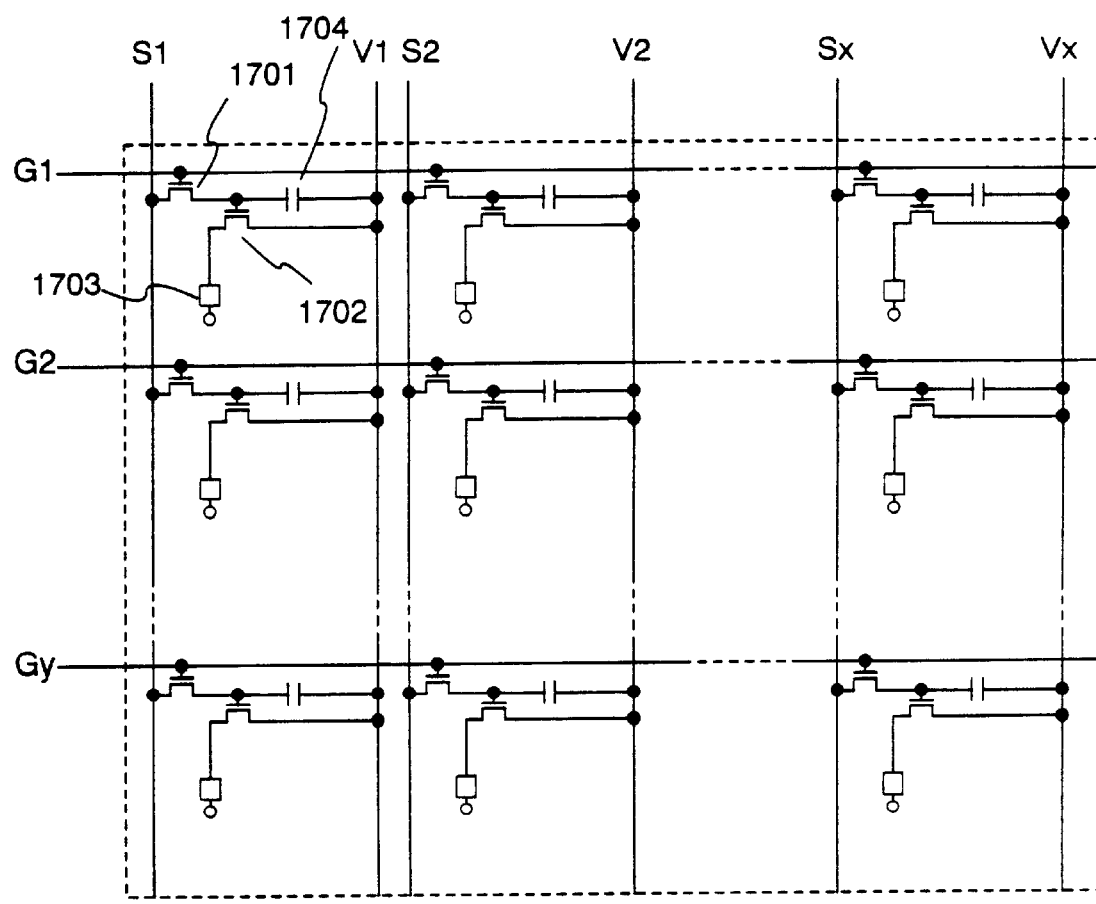
FIG. 18 is a circuit diagram of a pixel portion of a conventional EL display.
Figure 19:
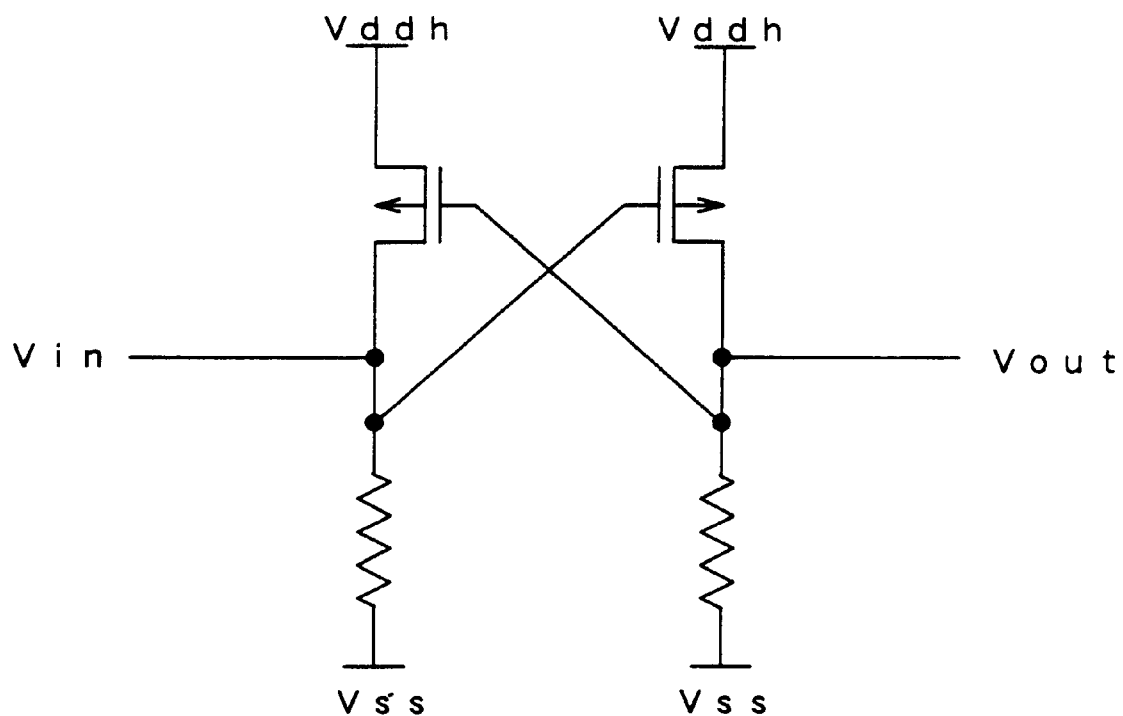
FIG. 19 is a circuit diagram of a pixel of the conventional EL display.

FIG. 17E depicts a portable (mobile) computer, which includes a main body 2501, camera 2502, image reception part 2503, operation switch 2504, and display portion 2505. The EL display of the present invention can be used as the display portion of a portable (mobile) computer.

If the luminescence brightness of the EL material is enhanced in the future, the present invention will be applicable to a front or rear type projector.

The present invention has a quite wide scope of application, as mentioned above, and is applicable to electronic apparatuses in all fields. The electronic apparatuses of this embodiment can be realized by the using any structure resulting from the free combination of embodiments 1 to 11.

According to the above structure, it becomes possible to control an EL driver voltage through an external switch connected to a gate electrode of a power source controlling TFT, and it becomes possible to remove a conventional large electric power external switch connected to an opposite electrode, for controlling an EL driver voltage. Thus, it becomes possible to remove the limitation of a current value of an EL driver circuit caused by the large electric power external switch connected to the opposite electrode, and it becomes possible to prevent a deterioration in the frequency characteristic due to the large electric power external switch connected to the opposite electrode and to prevent a decrease in the number of gradations.

Note that the power source controlling TFT can be formed at the same time as the switching TFT and the EL driving TFT.

What is claimed is:

1. An electric device comprising:
   a plurality of source signal lines;
   a plurality of gate signal lines;
   a plurality of power source supply lines;
   a plurality of power source control lines; and
   a plurality of pixels, each of the plurality of pixels including:
   a switching thin film transistor having a multi-gate structure,
   an EL driving thin film transistor,
   a power source controlling thin film transistor, and
   an EL element, and
wherein the power source controlling thin film transistor controls a potential difference between a cathode and an anode of the EL element.

2. An electric device comprising:
a plurality of source signal lines;
a plurality of gate signal lines;
a plurality of power source supply lines;
a plurality of power source control lines; and
a plurality of pixels,
each of the plurality of pixels including:
   a switching thin film transistor having a multi-gate structure,
   an EL driving thin film transistor,
   a power source controlling thin film transistor, and
   an EL element,
wherein a light emitting period in one frame period is controlled by a digital data signal, said light emitting period being defined as a period in which the EL element emits a light and
wherein the power source controlling thin film transistor controls a potential difference between a cathode and an anode of the El element.

3. An electric device comprising:
a plurality of source signal lines;
a plurality of gate signal lines;
a plurality of power source supply lines;
a plurality of power source control lines, and
a plurality of pixels,
each of the plurality of pixels including:
   a switching thin film transistor having a multi-gate structure,
   an EL driving thin film transistor,
   a power source controlling thin film transistor, and
   an EL element,
wherein one frame period includes n subframe periods $SF_1, SF_2, \ldots, SF_n$,
wherein the n subframe periods include write-in periods $Ta_1, Ta_2, \ldots, Ta_n$ and display periods $Ts_1, Ts_2, \ldots, Ts_n$,
wherein a plurality of digital data signals are inputted to all of the plurality of pixels in the write-in periods $Ta_1, Ta_2, \ldots, Ta_n$,
whether or not the plurality of EL elements emit a light in the display periods $Ts_1, Ts_2, \ldots, Ts_n$ is selected by the digital data signals,
wherein lengths of the write-in periods $Ta_1, Ta_2, \ldots, Ta_n$ are all identical,
wherein a ratio of lengths of the display periods $Ts_1, Ts_2, \ldots, Ts_n$ is expressed by $2^0:2^{-1}: \ldots : 2^{-(n-1)}$, and
wherein the power source controlling thin film transistor controls a potential difference between a cathode and an anode of the EL element.

4. A device according to claim 1,
wherein one of a source region and a drain region of the switching thin film transistor is connected to one of the plurality of source signal lines, and the other is connected to a gate electrode of the EL driving thin film transistor,
wherein one of a source region and a drain region of the EL driving thin film transistor is connected to one of the plurality of power source supply tines, and the other is connected to one of a source region and a drain region of the power source controlling thin film transistor,
wherein the other of the source region and the drain region of the power source controlling thin film transistor is connected to one of a cathode and an anode of the EL element, and
wherein a gate electrode of the power source controlling thin film transistor is connected to one of the plurality of power source control lines.

5. A device according to claim 1,
wherein one of a source region and a drain region of the switching thin film transistor is connected to one of the plurality of source signal lines, and the other is connected to a gate electrode of the EL driving thin film transistor,
wherein one of a source region and a drain region of the EL driving thin film transistor is connected to one of a source region and a drain region of the power source controlling thin film transistor, and the other is connected to one of a cathode and an anode of the EL element,
wherein the other of the source region and the drain region of the power source controlling thin film transistor is connected to one of the plurality of power source supply lines, and
wherein a gate electrode of the power source controlling thin film transistor is connected to one of the plurality of power source control lines.

6. A device according to claim 1, further comprising a capacitor between a gate electrode of the EL driving thin film transistor and one of the plurality of power source supply lines.

7. A device according to claim 1,
wherein each of the plurality of EL elements includes an EL layer between the anode and the cathode, and
wherein the EL layer includes one selected from group consisting of a low molecular organic material and a polymer organic material.

8. A device according to claim 7,
wherein the low molecular organic material is one selected from the group consisting of $Alq_3$ (tris-8-quinolilite-aluminum) and TPD (triphenyl amine derivative).

9. A device according to claim 7,
wherein the polymer organic material is one selected from the group consisting of PPV (polyphenylenevinylene), PVK (polyvinylcarbazole), and polycarbonate.

10. A device according to claim 1,
wherein one frame period is 1/60s or less.

11. A computer using the electric device of claim 1.
12. A video camera using the electric device of claim 1.
13. A DVD player using the electric device of claim 1.
14. A device according to claim 2,
wherein one of a source region and a drain region of the switching thin film transistor is connected to one of the plurality of source signal lines, and the other is connected to a gate electrode of the EL driving thin film transistor,
wherein one of a source region and a drain region of the EL driving thin film transistor is connected to one of the plurality of power source supply lines, and the other is connected to one of a source region and a drain region of the power source controlling thin film transistor, wherein the other of the source region and the drain region of the power source controlling thin film transistor is connected to one of a cathode and an anode of the EL element, and wherein a gate electrode of the power source controlling thin film transistor is connected to one of the plurality of power source control lines.

15. A device according to claim 2, wherein one of a source region and a drain region of the switching thin film transistor is connected to one of the plurality of source signal lines, and the other is connected to a gate electrode of the EL driving thin film transistor, wherein one of a source region and a drain region of the EL driving thin film transistor is connected to one of a source region and a drain region of the power source controlling thin film transistor, and the other is connected to one of a cathode and an anode of the EL element, wherein the other of the source region and the drain region of the power source controlling thin film transistor is connected to one of the plurality of power source supply lines, and wherein a gate electrode of the power source controlling thin film transistor is connected to one of the plurality of power source control lines.

16. A device according to claim 2, further comprising a capacitor between a gate electrode of the EL driving thin film transistor and one of the plurality of power source supply lines.

17. A device according to claim 2, wherein each of the plurality of EL elements includes an EL layer between the anode and the cathode, and wherein the EL layer includes one selected from group consisting of a low molecular organic material and a polymer organic material.

18. A device according to claim 17, wherein the low molecular organic material is one selected from the group consisting of Alq$_3$ (tris-8-quinolilite-aluminum) and TPD (triphenyl amine derivative).

19. A device according to claim 17, wherein the polymer organic material is one selected from the group consisting of PPV (polyphenylenevinylene), PVK (polyvinylcarbazole), and polycarbonate.

20. A device according to claim 2, wherein one frame period is 1/60s or less.

21. A computer using the electric device of claim 2.
22. A video camera using the electric device of claim 2.
23. A DVD player using the electric device of claim 2.
24. A device according to claim 3, wherein one of a source region and a drain region of the switching thin film transistor is connected to one of the plurality of source signal lines, and the other is connected to a gate electrode of the EL driving thin film transistor, p1 wherein one of a source region and a drain region of the EL driving thin film transistor is connected to one of the plurality of power source supply lines, and the other is connected to one of a source region and a drain region of the power source controlling thin film transistor, wherein the other of the source region and the drain region of the power source controlling thin film transistor is connected to one of a cathode and an anode of the EL element, and wherein a gate electrode of the power source controlling thin film transistor is connected to one of the plurality of power source control lines.

25. A device according to claim 3, wherein one of a source region and a drain region of the switching thin film transistor is connected to one of the plurality of source signal lines, and the other is connected to a gate electrode of the EL driving thin film transistor, wherein one of a source region and a drain region of the EL driving thin film transistor is connected to one of a source region and a drain region of the power source controlling thin film transistor, and the other is connected to one of a cathode and an anode of the EL element, wherein the other of the source region and the drain region of the power source controlling thin film transistor is connected to one of the plurality of power source supply lines, and wherein a gate electrode of the power source controlling thin film transistor is connected to one of the plurality of power source control lines.

26. A device according to claim 3, further comprising a capacitor between a gate electrode of the EL driving thin film transistor and one of the plurality of power source supply lines.

27. A device according to claim 3, wherein each of the plurality of EL elements includes an EL layer between the anode and the cathode, and wherein the EL layer includes one selected from group consisting of a low molecular organic material and a polymer organic material.

28. A device according to claim 27, wherein the low molecular organic material is one selected from the group consisting of Alq$_3$ (tris-8-quinolilite-aluminum) and TPD (triphenyl amine derivative).

29. A device according to claim 27, wherein the polymer organic material is one selected from the group consisting of PPV (polyphenylenevinylene), PVK (polyvinylcarbazole), and polycarbonate.

30. A device according to claim 3, wherein one frame period is 1/60s or less.

31. A computer using the electric device of claim 3.
32. A video camera using the electric device of claim 3.
33. A DVD player using the electric device of claim 3.

* * * * *